US010461073B2

(12) United States Patent
Sugimachi et al.

(10) Patent No.: US 10,461,073 B2
(45) Date of Patent: Oct. 29, 2019

(54) POWER MODULE WITH MOSFET BODY DIODE ON WHICH ENERGIZATION TEST CAN BE CONDUCTED EFFICIENTLY

(71) Applicant: Mitsubishi Electric Corporation, Tokyo (JP)

(72) Inventors: Seiya Sugimachi, Tokyo (JP); Masataka Shiramizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/342,231

(22) Filed: Nov. 3, 2016

(65) Prior Publication Data

US 2017/0207213 A1    Jul. 20, 2017

(30) Foreign Application Priority Data

Jan. 19, 2016    (JP) .................................. 2016-007940

(51) Int. Cl.
*H01L 27/06* (2006.01)
*G01R 31/42* (2006.01)
(Continued)

(52) U.S. Cl.
CPC .......... *H01L 27/0629* (2013.01); *G01R 31/42* (2013.01); *H01L 29/0619* (2013.01);
(Continued)

(58) Field of Classification Search
CPC .............. H01L 27/0629; H01L 29/0619; H01L 29/872; G01R 31/42
See application file for complete search history.

(56) References Cited

U.S. PATENT DOCUMENTS

2007/0090496 A1    4/2007  Otremba
2008/0157126 A1*   7/2008  Bertin .................... B82Y 10/00
                                                    257/209
(Continued)

FOREIGN PATENT DOCUMENTS

DE    10 2009 026 479 B4    12/2016
JP       2008-017237 A      1/2008
(Continued)

OTHER PUBLICATIONS

An Office Action issued by the German Patent and Trademark Office dated Dec. 3, 2018, which corresponds to German Patent Application No. 10 2017 200 074.0 and is related to U.S. Appl. No. 15/342,231; with English translation.
(Continued)

*Primary Examiner* — Cuong B Nguyen
*Assistant Examiner* — Samuel Park
(74) *Attorney, Agent, or Firm* — Studebaker & Brackett PC

(57) ABSTRACT

A power module includes a first MOS transistor and a first Schottky barrier diode for a lower arm, and a second MOS transistor and a second Schottky barrier diode for an upper arm. In one embodiment, one positive-side power supply terminal and one negative-side power supply terminal are provided, while an output terminal to which the first and second MOS transistors are connected and an output terminal to which the first and second Schottky barrier diodes are connected are provided as separate output terminals.

3 Claims, 19 Drawing Sheets

(51) Int. Cl.
 *H01L 29/872* (2006.01)
 *H01L 29/06* (2006.01)
 *H01L 21/66* (2006.01)

(52) U.S. Cl.
 CPC ............ *H01L 29/872* (2013.01); *H01L 22/32* (2013.01); *H01L 2224/48091* (2013.01); *H01L 2224/48137* (2013.01); *H01L 2224/48139* (2013.01); *H01L 2224/48247* (2013.01); *H01L 2924/19107* (2013.01)

(56) References Cited

U.S. PATENT DOCUMENTS

| 2011/0062491 | A1 | 3/2011 | Nakata |
| 2011/0164957 | A1 | 7/2011 | Rivas et al. |
| 2013/0120940 | A1* | 5/2013 | Landau ................... H01L 23/10 361/720 |
| 2013/0248883 | A1* | 9/2013 | Das ......................... H01L 25/18 257/77 |
| 2016/0190126 | A1* | 6/2016 | Bauer .................... H01L 29/36 257/476 |

FOREIGN PATENT DOCUMENTS

| JP | 2009-171190 A | 7/2009 |
| JP | 2011-137459 A | 7/2011 |
| WO | 2010/004802 A1 | 1/2010 |

OTHER PUBLICATIONS

An Office Action issued by the Chinese Patent Office (SIPO) dated Nov. 2, 2018, which corresponds to Chinese Patent Application No. 201710038848.7 and is related to U.S. Appl. No. 15/342,231; with English language translation.

* cited by examiner

POWER MODULE WITH MOSFET BODY DIODE ON WHICH ENERGIZATION TEST CAN BE CONDUCTED EFFICIENTLY

BACKGROUND OF THE INVENTION

Field of the Invention

The present disclosure relates to a power module in which a MOSFET (Metal Oxide Semiconductor Field Effect Transistor) is incorporated, and to a three-phase inverter system including this power module. The present disclosure further relates to a method of testing a power module.

Description of the Background Art

A power module in which a power MOSFET and a freewheeling diode connected in anti-parallel with the power MOSFET are incorporated has been brought into practical use. In such a power module, a Schottky barrier diode characterized by a high-speed switching operation and a low forward voltage drop is often used as the freewheeling diode (see for example WO2010/004802).

One of failure modes of the MOSFET (also referred to as MOS transistor) is degradation of a body diode resulting from energization thereof. This failure occurs when forward current is continuously applied to a PN junction diode like a body diode, due to growth of a stacking fault in an epitaxial layer caused by electron-hole pair binding energy. Particularly in the case where a wide-bandgap semiconductor such as SiC (silicon carbide) and GaN (gallium nitride) and the like is used as a semiconductor material, the stacking fault is likely to occur and therefore this failure mode is likely to present a problem.

SUMMARY OF THE INVENTION

In the case where a Schottky barrier diode with a low forward voltage drop is used as the freewheeling diode, most of freewheeling current flows through the Schottky barrier diode. Thus, current flowing through the body diode of the MOSFET can be reduced. However, when the MOSFET performs a switching operation, counter-electromotive force which occurs in a parasitic inductance component at each of the collector terminal and the emitter terminal of the MOSFET as well as the cathode terminal and the anode terminal of the freewheeling diode causes instantaneous current to flow through the body diode of the MOSFET. Therefore, degradation of the body diode resulting from energization may still present a problem.

Usually, for a power module in which a MOSFET is incorporated, an energization test is conducted by applying forward current to the body diode for a predetermined time. In this way, low-quality chips are screened out (because degradation in characteristics of the low-quality chips is promoted). However, in the case where a Schottky barrier diode is used as the freewheeling diode, it is difficult to effectively conduct this screening. This is for the reason that most of current flows through the freewheeling diode, and therefore, the energization time has to be made considerably long.

The present disclosure takes the above-described problems into consideration, and a main object of the present disclosure is to provide a power module with a MOSFET body diode on which an energization test can be conducted efficiently, even when a Schottky barrier diode is used as the freewheeling diode.

According to a first aspect of the present disclosure, a power module includes: a casing; a first terminal, a second terminal, a third terminal, and a fourth terminal which are fixed to the casing and connectable to an outside; a first MOS (Metal Oxide Semiconductor) transistor; a second MOS transistor; a first Schottky barrier diode; and a second Schottky barrier diode. The first MOS transistor is contained in the casing, is connected between the first terminal and the second terminal, and has a forward direction from the second terminal to the first terminal. The second MOS transistor is contained in the casing, is connected between the second terminal and the third terminal, and has a forward direction from the third terminal to the second terminal. The first Schottky barrier diode is contained in the casing, has an anode connected to the first terminal, and has a cathode connected to the fourth terminal. The second Schottky barrier diode is contained in the casing, has a cathode connected to the third terminal, and has an anode connected to the fourth terminal. No other diode except for respective body diodes of the first and second MOS transistors is connected to the second terminal.

According to a second aspect of the present disclosure, a power module includes: a casing; a first terminal, a second terminal, a third terminal, a fourth terminal, and a fifth terminal which are fixed to the casing and connectable to an outside; a first MOS transistor; a second MOS transistor; a first Schottky barrier diode; and a second Schottky barrier diode. The first MOS transistor is contained in the casing, is connected between the first terminal and the second terminal, and has a forward direction from the second terminal to the first terminal. The second MOS transistor is contained in the casing, is connected between the second terminal and the third terminal, and has a forward direction from the third terminal to the second terminal. The first Schottky barrier diode is contained in the casing, has a cathode connected to the second terminal, and has an anode connected to the fourth terminal. The second Schottky barrier diode is contained in the casing, has an anode connected to the second terminal, and has a cathode connected to the fifth terminal.

According to a third aspect of the present disclosure, a power module includes: a casing; a first terminal, a second terminal, and a third terminal which are fixed to the casing and connectable to an outside; a first MOS transistor; a second MOS transistor; a first Schottky barrier diode; and a second Schottky barrier diode. The first MOS transistor is contained in the casing, is connected between the first terminal and the second terminal, and has a forward direction from the second terminal to the first terminal. The second MOS transistor is contained in the casing, is connected between the second terminal and the third terminal, and has a forward direction from the third terminal to the second terminal. The first Schottky barrier diode is contained in the casing, is parallel with the first MOS transistor, has an anode connected to the first terminal, and has a cathode connected to the second terminal. The second Schottky barrier diode is contained in the casing, is parallel with the second MOS transistor, has an anode connected to the second terminal, and has a cathode connected to the third terminal. A current value at a first crossing point is within a range of ±10% of a rated current of the power module, where the first crossing point is a crossing point of:

a current-voltage characteristic of the first MOS transistor when forward current is caused to flow in a body diode of the first MOS transistor; and a current-voltage characteristic of the first Schottky barrier diode when forward current is caused to flow in the first Schottky barrier diode. Further, a current value at a second crossing point is within a range of +10% of the rated current of the power module, where the second crossing point is a crossing point of:

a current-voltage characteristic of the second MOS transistor when forward current is caused to flow in a body diode of the second MOS transistor, and a current-voltage characteristic of the second Schottky barrier diode when forward current is caused to flow in the second Schottky barrier diode.

The significant feature of the power module according to the first aspect is that two separate output terminals configured to output an AC voltage are provided, namely an output terminal (second terminal) between the first and second MOSFETs and an output terminal (fourth terminal) between the first and second freewheeling diodes. The significant feature of the power module according to the second aspect is that two separate positive-side terminals and two separate negative-side terminals configured to receive an input DC voltage are provided, namely negative-side terminals (first terminal and fourth terminal) respectively connected to the first MOSFET and the first freewheeling diode and positive-side terminals (third terminal and fifth terminal) respectively connected to the second MOSFET and the second freewheeling diode. Thus, when an energization test is conducted, forward current can be caused to flow in only the body diode of the MOSFET. Therefore, low-quality MOSFET chips can be screened out efficiently.

Further, regarding the power module according to the third aspect, current larger than the rated current is caused to flow in the forward direction of the body diode of the MOSFET when an energization test is conducted, to thereby allow more forward current to flow in the body diode than the current flowing in the freewheeling diode. Thus, low-quality MOSFET chips can be screened out efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
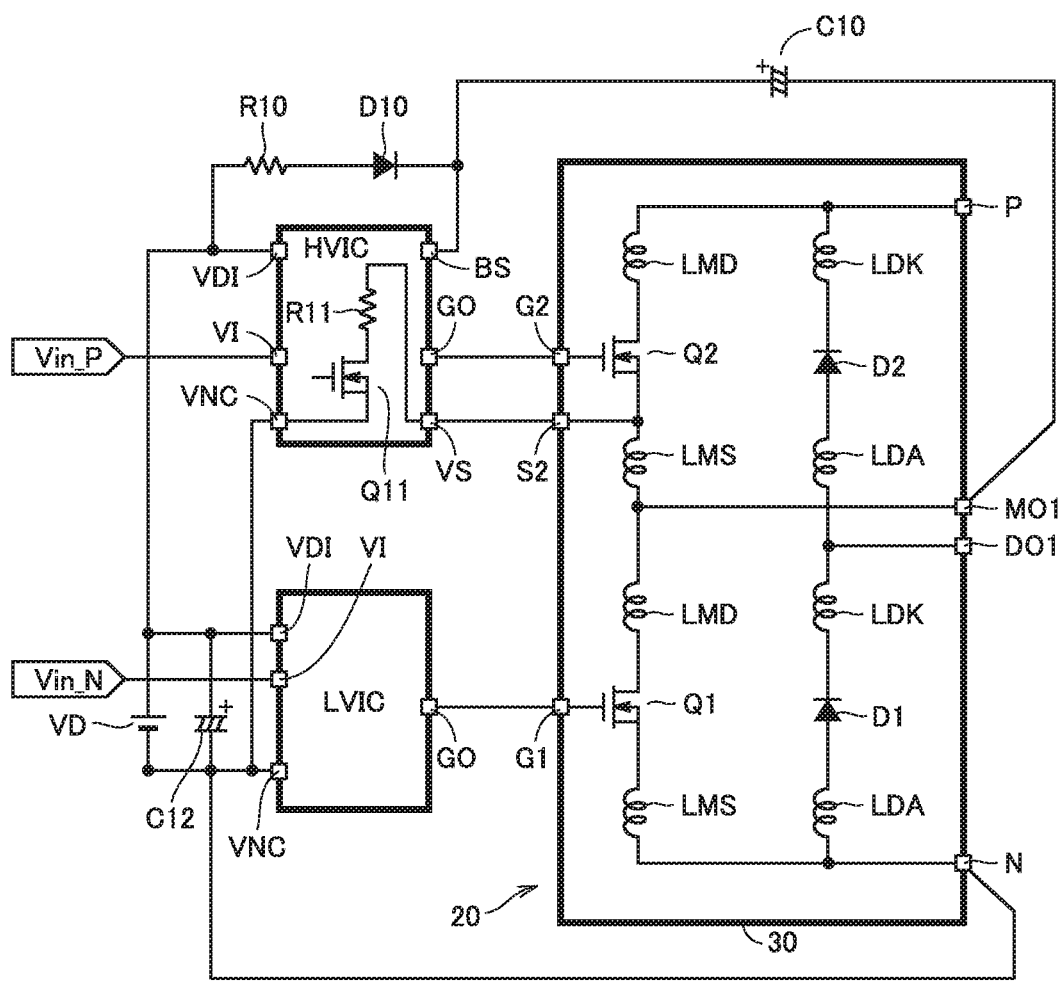
FIG. 1 is a circuit diagram showing a configuration of a power module 20 in a first embodiment.

Each embodiment will hereinafter be described in detail with reference to the drawings. In each of the following embodiments, a wide-bandgap semiconductor such as SiC (silicon carbide) and GaN (gallium nitride) and the like is used as a semiconductor material. The semiconductor material, however, is not limited to this. In the following description, the same or corresponding elements are denoted by the same reference characters, and a description thereof may not be repeated in some cases.

<First Embodiment>
[Configuration of Power Module]

FIG. 1 is a circuit diagram showing a configuration of a power module 20 in a first embodiment. FIG. 1 additionally shows a high-voltage integrated circuit HVIC and a low-voltage integrated circuit LVIC which serve as components of a gate driving circuit configured to drive the power module.

Referring to FIG. 1, power module 20 includes a casing 30 which is electrically insulating (made of resin for example), a negative-side terminal N, an output terminal MO1, a positive-side terminal P, an output terminal DO1, a first MOS transistor Q1, a second MOS transistor Q2, a first Schottky barrier diode D1, and a second Schottky barrier diode D2.

Negative terminal N, output terminals MO1, DO1, and positive-side terminal P are fixed to casing 30 and connectable to an outside of power module 20. As shown in FIG. 1, a characteristic feature is that two separate output terminals MO1, DO1 are provided.

MOS transistor Q1 is contained in casing 30 and connected between negative-side terminal N and output terminal MO1. MOS transistor Q1 is an N-channel MOS transistor having a vertical structure. MOS transistor Q1 has a forward direction from output terminal MO1 to negative-side terminal N (the direction from the drain to the source). A body diode of MOS transistor Q1 has a forward direction from negative-side terminal N to output terminal MO1 (the direction from the anode to the cathode of the body diode). As shown in FIG. 1, at the drain and the source of MOS transistor Q1, respective parasitic inductances LMD and LMS are introduced by a wire.

MOS transistor Q2 is contained in casing 30 and connected between output terminal MO and positive-side terminal P. MOS transistor Q2 is an N-channel MOS transistor having a vertical structure. MOS transistor Q2 has a forward direction from positive-side terminal P to output terminal MO1 (the direction from the drain to the source). A body diode of MOS transistor Q2 has a forward direction from output terminal MO1 to positive-side terminal P (the direction from the anode to the cathode of the body diode). As shown in FIG. 1, at the drain and the source of MOS transistor Q2, respective parasitic inductances LMD and LMS are introduced by a wire.

Schottky barrier diode D1 is contained in casing 30, has an anode connected to negative-side terminal N, and has a cathode connected to output terminal DO1. As shown in FIG. 1, at the anode and the cathode of Schottky barrier diode D1, respective parasitic inductances LDA and LDK are introduced by a wire.

Schottky barrier diode D2 is contained in casing 30, has a cathode connected to positive-side terminal P, and has an anode connected to output terminal DO1. As shown in FIG. 1, at the anode and the cathode of Schottky barrier diode D2, respective parasitic inductances LDA and LDK are introduced by a wire.

In the above-described configuration, no other diode except for respective body diodes of MOS transistors Q1, Q2 is connected to output terminal MO1 which is one of output terminals MO1, DO1. Thus, when an energization test is conducted, forward current can be caused to flow in respective body diodes of MOS transistors Q1, Q2 through a path which is separate from a path through Schottky barrier diodes D1, D2. When the power module is used as a half bridge, a DC voltage is applied between positive-side terminal P and negative-side terminal N, and output terminals MO1, DO1 are connected to a common output node (not shown) configured to output an AC voltage.

Power module 20 further includes gate terminals G1, G2 and a source terminal S2, and these gate terminals and source terminal are fixed to casing 30. Gate terminals G1, G2 are connected to respective gates of MOS transistors Q1, Q2, and source terminal S2 is connected to the source of MOS transistor Q2.

[Configuration of Gate Driving Circuit]

Referring to FIG. 1, the gate driving circuit of power module 20 includes low-voltage integrated circuit LVIC, high-voltage integrated circuit HVIC, a DC power supply VD, a capacitor C12, a resistor element R10, a diode D10, and a capacitor C10.

Low-voltage integrated circuit LVIC is equipped with terminals GO, VDI, VI, VNC. Low-voltage integrated circuit LVIC outputs, to gate terminal G1 of power module 20 via terminal GO, a gate driving voltage in accordance with control signal Vin_N which is input to terminal VI. Terminal VNC serves as a reference potential node and is connected to negative-side terminal N of power module 20. Between terminal VNC and terminal VDI, DC power supply VD and capacitor C12 are connected in parallel with each other.

High-voltage integrated circuit HVIC is equipped with terminals GO, VS, VDI, VI, VNC, BS. High-voltage integrated circuit HVIC outputs, to gate terminal G2 of power module 20 via terminal GO, a gate driving voltage in accordance with control signal Vin_P which is input to terminal VI. Terminal VNC serves as a reference potential node and is connected to negative-side terminal N of power module 20. Between terminal VNC and terminal VDI, DC power supply VD and capacitor C12 are connected in parallel with each other.

A circuit for bootstrapping is connected to terminal BS of high-voltage integrated circuit HVIC. Namely, capacitor C10 is connected between terminal BS and output terminal MO1 of the power module. The cathode of diode D10 is further connected to terminal BS. The anode of diode D10 is connected via resistor element R10 to terminal VDI (and therefore to the positive electrode of DC power supply VD). Accordingly, when MOS transistor Q1 is ON, a voltage of DC power supply VD is applied to terminal BS and this voltage is stored in capacitor C10. When MOS transistor Q1 is OFF and MOS transistor Q2 is ON, a potential, which is determined by adding the voltage stored in capacitor C10 (the voltage of DC power supply VD) to the potential of positive-side terminal P, is input to terminal BS.

Terminal VS of high-voltage integrated circuit HVIC is connected to source terminal S2 of power module 20 (the source of MOS transistor Q2) and connected to terminal VNC (reference potential) via resistor element RI 1 and MOS transistor Q11 which are internal elements of high-voltage integrated circuit HVIC. When MOS transistor Q1 is ON, MOS transistor Q11 may also be rendered ON to quickly make the potential of output terminal MO1 of power module 20 equal to the reference potential.

[Layout of Semiconductor Chip on Insulating Substrate]

Figure 2:
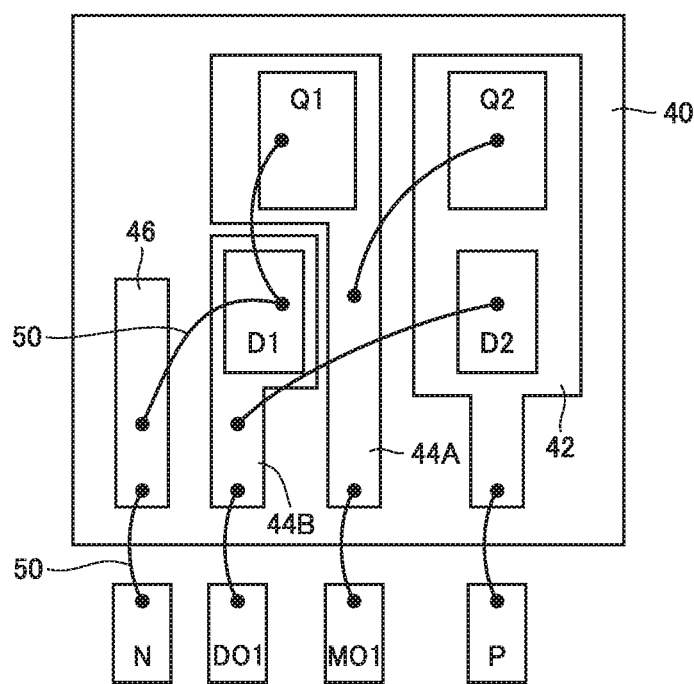
FIG. 2 is a plan view showing an example of the layout of a semiconductor chip contained in power module 20 in FIG. 1.

FIG. 2 is a plan view showing an example of the layout of a semiconductor chip contained in power module 20 in FIG. 1. Referring to FIG. 2, power module 20 further includes an insulating substrate 40 contained in casing 30 in FIG. 1, and conductive patterns 42, 44A, 44B, 46 formed of copper foil or the like on insulating substrate 40.

Conductive pattern 42 is connected via a bonding wire 50 to positive-side terminal P. Conductive pattern 44A is connected via bonding wire 50 to output terminal MO1. Conductive pattern 44B is connected via bonding wire 50 to output terminal DO1. Conductive pattern 46 is connected via bonding wire 50 to negative-side terminal N.

The drain electrode of MOS transistor Q1 is connected by solder onto conductive pattern 44A. The cathode electrode of Schottky barrier diode D1 is connected by solder onto conductive pattern 44B. The drain electrode of MOS transistor Q2 and the cathode electrode of Schottky barrier diode D2 are connected by solder onto conductive pattern 42.

The source electrode of MOS transistor Q1 and the anode electrode of Schottky barrier diode D1 are connected via bonding wire 50 to conductive pattern 46. The source electrode of MOS transistor Q2 is connected via bonding wire 50 to conductive pattern 44A. The anode electrode of Schottky barrier diode D2 is connected via bonding wire 50 to conductive pattern 44B. While FIG. 2 shows that the conductive patterns and the bonding wire are used as interconnection for connecting the semiconductor chip to the terminals, the interconnection is not limited to this.

[Procedure for Testing Power Module]

Figure 3:
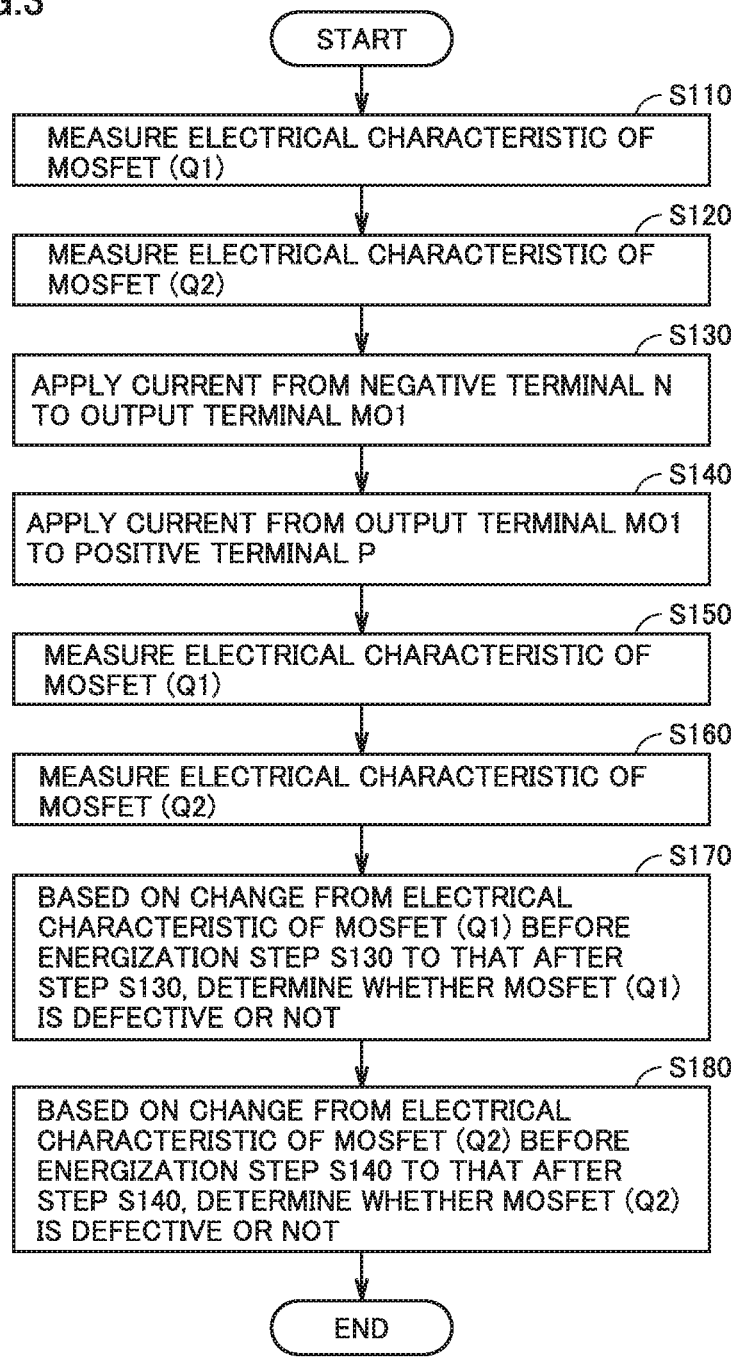
FIG. 3 is a flowchart showing a procedure of an energization test on power module 20 in FIG. 1.

FIG. 3 is a flowchart showing a procedure of an energization test on power module 20 in FIG. 1. The following steps may each be performed by an automatic testing apparatus configured as a computer-based apparatus.

Referring to FIG. 3, before energization of the body diodes of the MOS transistors, measurement of an electrical characteristic of MOS transistor Q1 (step S110) and measurement of the electrical characteristic of MOS transistor Q2 (step S120) are initially performed. There is no limitation on which one of steps S110 and S120 is to be performed first. The electrical characteristic to be measured may for example be forward voltage drop, forward leakage current, or the like.

Next, DC current is applied for a predetermined time in the direction from negative-side terminal N to output terminal MO1 (step S130). Thus, the body diode of MOS transistor Q1 is energized with forward current. Further, DC current is applied for a predetermined time in the direction from output terminal MO1 to positive-side terminal P (step S140). Thus, the body diode of MOS transistor Q2 is energized with forward current. There is no limitation on which one of steps S130 and S140 is to be performed first.

After the above-described energization steps S130, S140, measurement of the electrical characteristic of MOS transistor Q1 (step S150) and measurement of the electrical characteristic of MOS transistor Q2 (step S160) are performed. The electrical characteristic to be measured is the same as that in steps S110, S120. There is no limitation on which one of steps S150 and S160 is to be performed first.

After this, based on a change from the electrical characteristic of MOS transistor Q1 before energization step S130 to the electrical characteristic thereof after energization step S130, it is determined whether MOS transistor Q1 is defective or not (step S170). Further, based on a change from the electrical characteristic of MOS transistor Q2 before energization step S140 to the electrical characteristic thereof after energization step S140, it is determined whether MOS transistor Q2 is defective or not (step S180). For example, when the forward voltage drop and the forward leakage current of an MOS transistor have hardly changed, the MOS transistor is determined as non-defective. In contrast, when one of the value representing the forward voltage drop and the value representing the forward leakage current has changed to exceed a threshold value, the MOS transistor is determined as defective. There is no limitation on which one of steps S170 and S180 is to be performed first.

[Effects]

As seen from the foregoing, the significant feature of power module 20 according to the first embodiment is that two separate output terminals of the half bridge are provided, namely output terminal MO1 between MOS transistors Q1, Q2 and output terminal DO1 between freewheeling diodes D1, D2. As a result of this, forward current can be caused to flow in only the respective body diodes of MOS transistors Q1, Q2 when an energization test is conducted. Therefore, low-quality MOS transistor chips can be screened out efficiently.

<Second Embodiment>

[Configuration of Power Module]

Figure 4:
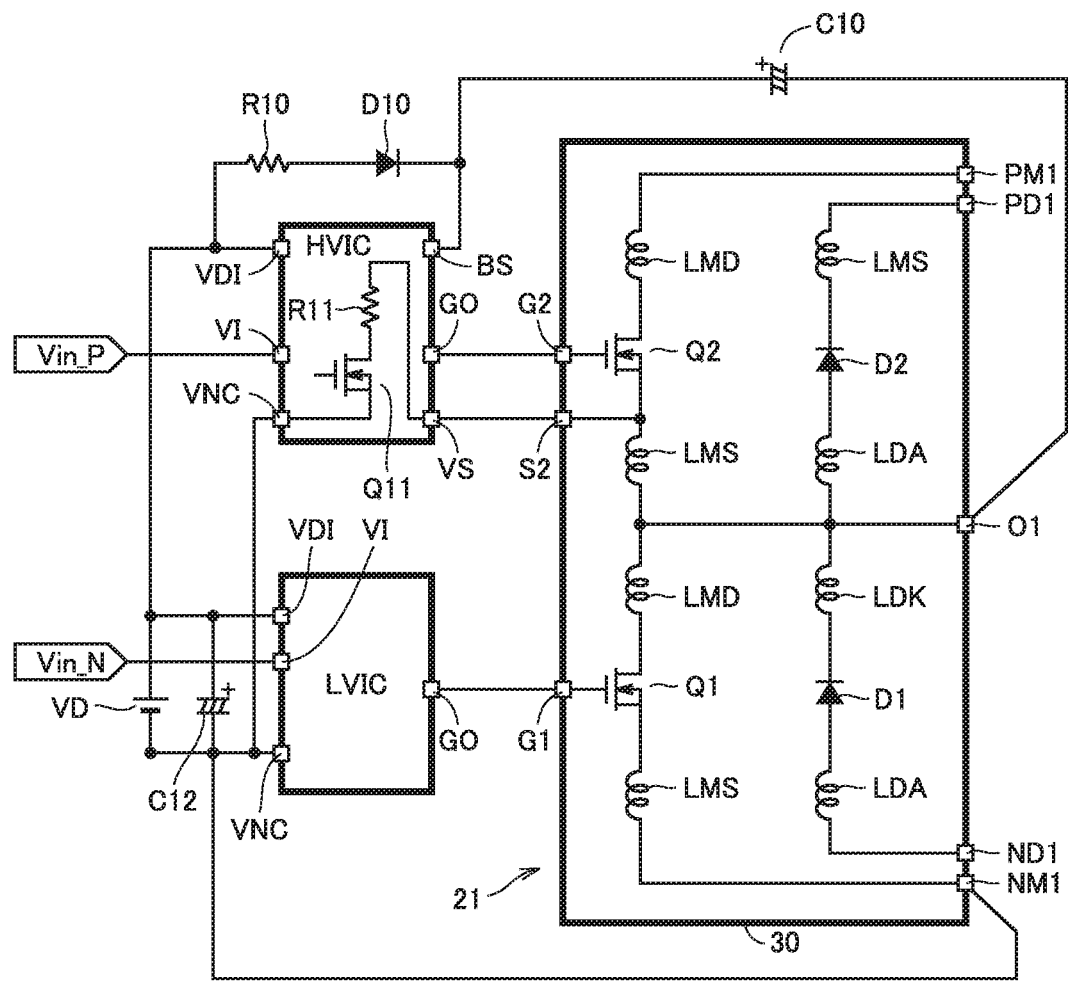
FIG. 4 is a circuit diagram showing a configuration of a power module 21 in a second embodiment.

FIG. 4 is a circuit diagram showing a configuration of a power module 21 in a second embodiment. FIG. 4 additionally shows a high-voltage integrated circuit HVIC and a low-voltage integrated circuit LVIC which serve as components of a gate driving circuit configured to drive the power module.

Power module 21 in FIG. 4 is obtained by changing the number of terminals of power module 20 in FIG. 1 and changing the connection between each semiconductor chip and the terminals of power module 20. Specifically, power module 21 includes a casing 30, a negative-side terminal NM1, an output terminal O1, a positive-side terminal PM1, a negative-side terminal ND1, a positive-side terminal PD1, a first MOS transistor Q1, a second MOS transistor Q2, a first Schottky barrier diode D1, and a second Schottky barrier diode D2.

Negative terminals ND1, NM1, output terminal O1, and positive-side terminals PM1, PD1 are fixed to casing 30 and connectable to an outside of the power module. As shown in FIG. 4, a characteristic feature is that two separate positive-side terminals PM1, PD1 are provided and two separate negative-side terminals ND1, NM1 are provided.

MOS transistor Q1 is contained in casing 30 and connected between negative-side terminal NM1 and output terminal O1. MOS transistor Q1 is an N-channel MOS transistor having a vertical structure. MOS transistor Q1 has a forward direction from output terminal O1 to negative-side terminal NM1 (the direction from the drain to the source). A body diode of MOS transistor Q1 has a forward direction from negative-side terminal NM1 to output terminal O1 (the direction from the anode to the cathode of the body diode).

MOS transistor Q2 is contained in casing 30 and connected between output terminal O1 and positive-side terminal PM1. MOS transistor Q2 is an N-channel MOS transistor having a vertical structure. MOS transistor Q2 has a forward direction from positive-side terminal PM1 to output terminal O1 (the direction from the drain to the source). A body diode of MOS transistor Q2 has a forward direction from output terminal O1 to positive-side terminal PM1 (the direction from the anode to the cathode of the body diode).

Schottky barrier diode D1 is contained in casing 30, has an anode connected to negative-side terminal ND1, and has a cathode connected to output terminal O1. Schottky barrier diode D2 is contained in casing 30, has a cathode connected to positive-side terminal PD1, and has an anode connected to output terminal O1. Other features in FIG. 4 are similar to those in the first embodiment described above in connection with FIG. 1. Therefore, the same or corresponding elements are denoted by the same reference characters, and the description thereof will not be repeated herein.

In the above-described configuration, when an energization test is conducted, forward current can be caused to flow in respective body diodes of MOS transistors Q1, Q2 through a path which is separate from a path through Schottky barrier diodes D1, D2. When the power module is used as a half bridge, positive-side terminals PM1, PD1 are connected to a common positive-side input node (not shown), negative-side terminals ND1, NM1 are connected to a common negative-side input node (not shown), and a DC voltage is applied between the positive-side input node and the negative-side input node. An AC voltage is output from output terminal O1.

[Configuration of Gate Driving Circuit]

Referring to FIG. 4, a capacitor C10 for bootstrapping is connected between terminal BS of high-voltage integrated circuit HVIC and output terminal O1 of power module 21. Other features are similar to those in FIG. 1. Therefore, the same or corresponding elements are denoted by the same reference characters, and the description thereof will not be repeated herein.

[Layout of Semiconductor Chip on Insulating Substrate]

Figure 5:
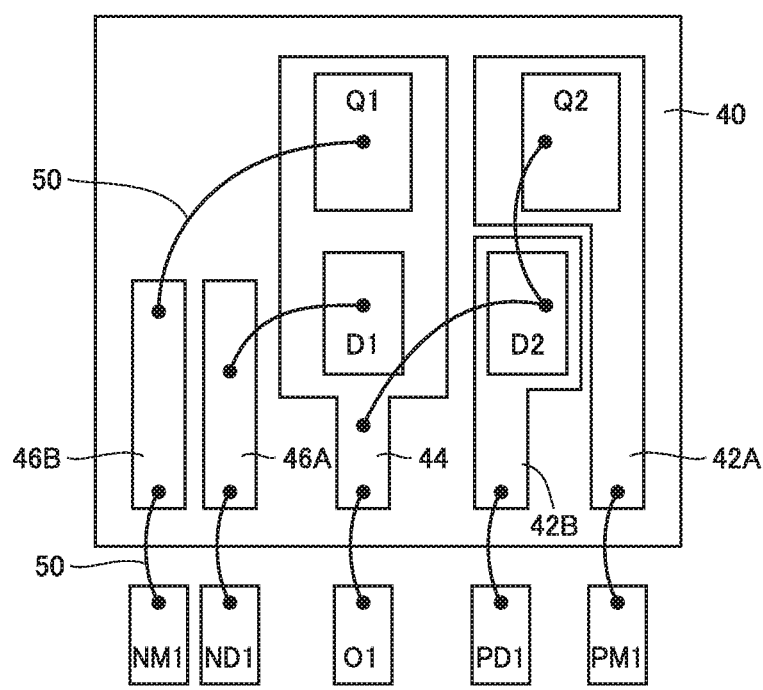
FIG. 5 is a plan view showing an example of the layout of a semiconductor chip contained in power module 21 in FIG. 4.

FIG. 5 is a plan view showing an example of the layout of a semiconductor chip contained in power module 21 in FIG. 4. Referring to FIG. 5, power module 21 further includes an insulating substrate 40 contained in casing 30 in FIG. 4, and conductive patterns 42A, 42B, 44, 46A, 46B formed of copper foil or the like on insulating substrate 40.

Conductive pattern 42A is connected via a bonding wire 50 to positive-side terminal PM1. Conductive pattern 42B is connected via bonding wire 50 to positive-side terminal PD1. Conductive pattern 44 is connected via bonding wire 50 to output terminal O1. Conductive pattern 46A is connected via bonding wire 50 to negative-side terminal ND1. Conductive pattern 46B is connected via bonding wire 50 to negative-side terminal NM1.

The drain electrode of MOS transistor Q1 and the cathode electrode of Schottky barrier diode D1 are connected by solder onto conductive pattern 44. The drain electrode of MOS transistor Q2 is connected by solder onto conductive pattern 42A. The cathode electrode of Schottky barrier diode D2 is connected by solder onto conductive pattern 42B.

The source electrode of MOS transistor Q1 is connected via bonding wire 50 to conductive pattern 46B. The anode electrode of Schottky barrier diode D1 is connected via bonding wire 50 to conductive pattern 46A. The source electrode of MOS transistor Q2 and the anode electrode of Schottky barrier diode D2 are connected via bonding wire 50 to conductive pattern 44. While FIG. 5 shows that the conductive patterns and the bonding wire are used as interconnection for connecting the semiconductor chip to the terminals, the interconnection is not limited to this.

[Procedure for Testing Power Module]

Figure 6:
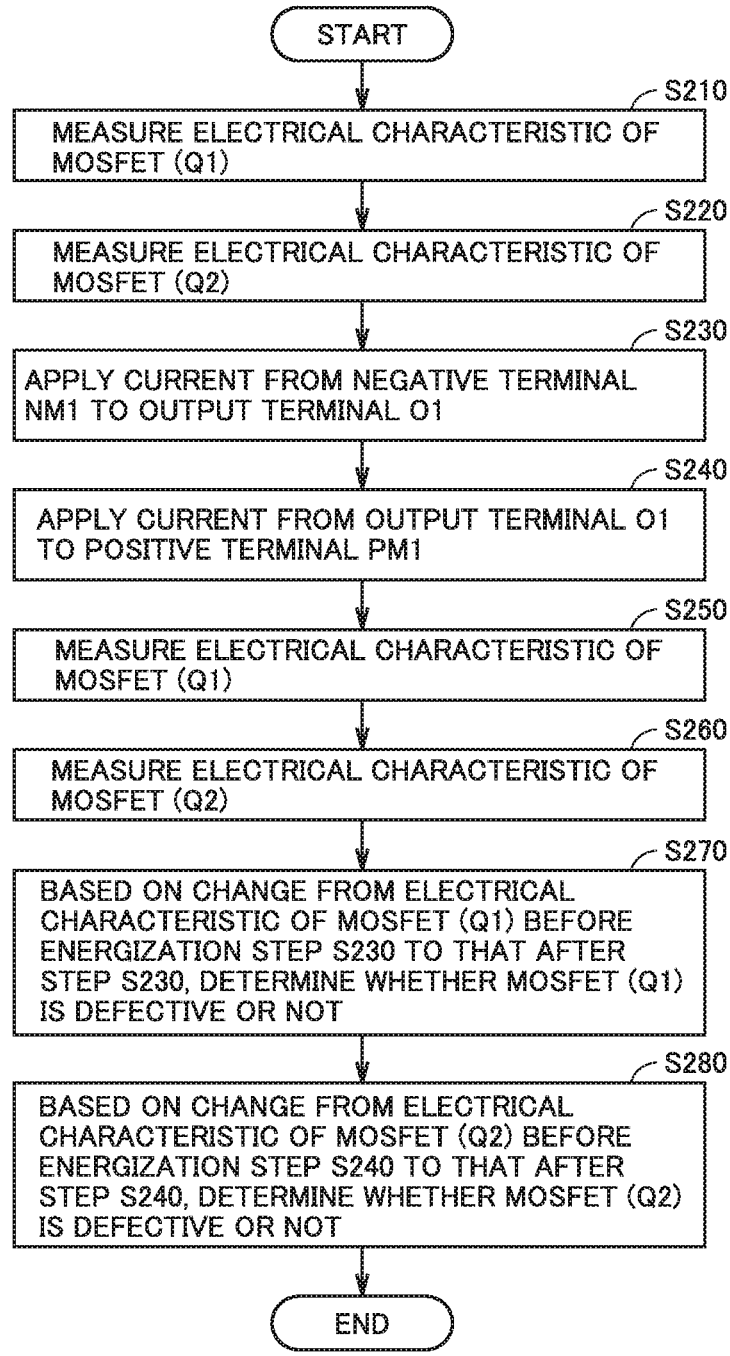
FIG. 6 is a flowchart showing a procedure of an energization test on power module 21 in FIG. 4.

FIG. 6 is a flowchart showing a procedure of an energization test on power module 21 in FIG. 4. Each step in FIG. 6 may be performed by an automatic testing apparatus configured as a computer-based apparatus.

Steps S210, S220, S230, S240, S250, S260, S270, and S280 in FIG. 6 correspond to steps S110, S120, S130, S140, S150, S160, S170, and S180 in FIG. 3, respectively. Except for the energized portion in steps S230, S240, each step in FIG. 6 is substantially identical to the corresponding step in FIG. 3. Therefore, the description thereof will not be repeated herein.

In step S230, DC current is applied for a predetermined time in the direction from negative-side terminal NM1 to output terminal O1. Thus, the body diode of MOS transistor Q1 is energized with forward current. In step S240, DC current is applied for a predetermined time in the direction from output terminal O1 to positive-side terminal PM1. Thus, the body diode of MOS transistor Q2 is energized with forward current. There is no limitation on which one of steps S230 and S240 is to be performed first.

[Effects]

As seen from the foregoing, regarding power module 21 of the second embodiment, the two separate positive-side terminals and the two separate negative-side terminals for receiving a DC voltage are provided, namely positive-side terminal PM1 and negative-side terminal NM1 respectively connected to MOS transistors Q1, Q2, and positive-side terminal PD1 and negative-side terminal ND1 respectively connected to freewheeling diodes D1, D2. As a result of this, forward current can be caused to flow in only the respective body diodes of MOS transistors Q1, Q2 when an energization test is conducted. Therefore, low-quality MOS transistor chips can be screened out efficiently.

<Third Embodiment>

[Full-Bridge Configuration]

Figure 7:
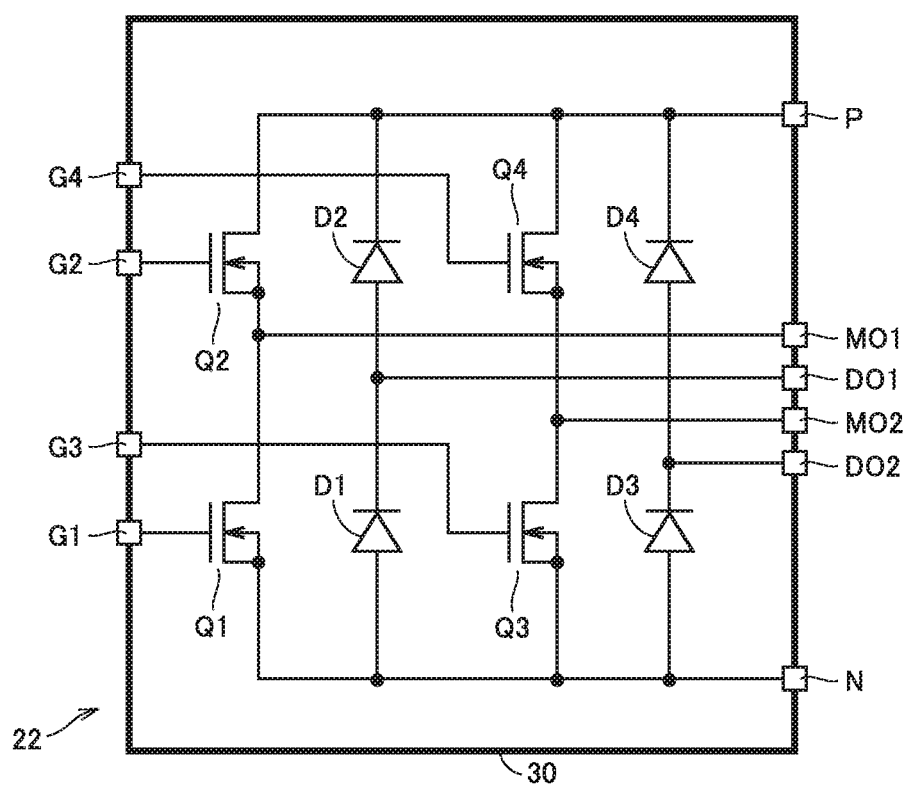
FIG. 7 is a circuit diagram showing a configuration of a power module 22 in a third embodiment.

FIG. 7 is a circuit diagram showing a configuration of a power module 22 in a third embodiment. In FIG. 7, an example of the extension from power module 20 in FIG. 1 to a full-bridge configuration is shown.

Referring to FIG. 7, power module 22 differs from power module 20 in FIG. 1 in that power module 22 further includes an output terminal MO2, an output terminal DO2, a third MOS transistor Q3, a fourth MOS transistor Q4, a third Schottky barrier diode D3, and a fourth Schottky barrier diode D4.

Like the configuration in FIG. 1, output terminals MO2, DO2 are fixed to casing 30 and connectable to an outside of power module 22. A characteristic feature is that two separate output terminals MO2, DO2 are provided.

MOS transistor Q3 is contained in casing 30 and connected between negative-side terminal N and output terminal MO2. MOS transistor Q3 is an N-channel MOS transistor having a vertical structure. MOS transistor Q3 has a forward direction from output terminal MO2 to negative-side terminal N (the direction from the drain to the source). A body diode of MOS transistor Q3 has a forward direction from negative-side terminal N to output terminal MO2 (the direction from the anode to the cathode of the body diode).

MOS transistor Q4 is contained in casing 30 and connected between output terminal MO2 and positive-side terminal P. MOS transistor Q4 is an N-channel MOS transistor having a vertical structure. MOS transistor Q4 has a forward direction from positive-side terminal P to output terminal MO2 (the direction from the drain to the source). A body diode of MOS transistor Q4 has a forward direction from output terminal MO2 to positive-side terminal P (the direction from the anode to the cathode of the body diode).

Schottky barrier diode D3 is contained in casing 30, has an anode connected to negative-side terminal N, and has a cathode connected to output terminal DO2. Schottky barrier diode D4 is contained in casing 30, has a cathode connected to positive-side terminal P, and has an anode connected to output terminal DO2.

In the above-described configuration, no other diode except for respective body diodes of MOS transistors Q1, Q2 is connected to output terminal MO1 which is one of output terminals MO1, MO2, DO1, DO2, and no other diode except for respective body diodes of MOS transistors Q3, Q4 is connected to output terminal MO2 which is another one of output terminals MO1, MO2, DO1, DO2. Thus, when an energization test is conducted, forward current can be caused to flow in respective body diodes of MOS transistors Q1, Q2, Q3, Q4 through corresponding paths which are separate from the paths through Schottky barrier diodes D1, D2, D3, D4. When the power module is used as an inverter system, a DC voltage is applied between positive-side terminal P (positive-side input node) and negative-side terminal N (negative-side input node). Further, output terminals MO1, DO1 are connected to a common U-phase output node (not shown) configured to output a U-phase AC voltage, and output terminals MO2, DO2 are connected to a common V-phase output node (not shown) configured to output a V-phase AC voltage.

Power module 22 further includes gate terminals G1, G2, G3, G4 and source terminals S2, S4 (not shown), and these gate terminals and source terminals are fixed to casing 30. Gate terminals G1, G2, G3, G4 are connected to respective gates of MOS transistors Q1, Q2, Q3, Q4, and source terminals S2, S4 are connected to respective sources of MOS transistors Q2, Q4. Other features in FIG. 7 are similar to those of the configuration of power module 20 in FIG. 1. Therefore, the same or corresponding elements are denoted by the same reference characters, and the description thereof will not be repeated herein.

[Three-Phase Bridge Configuration]

Figure 8:
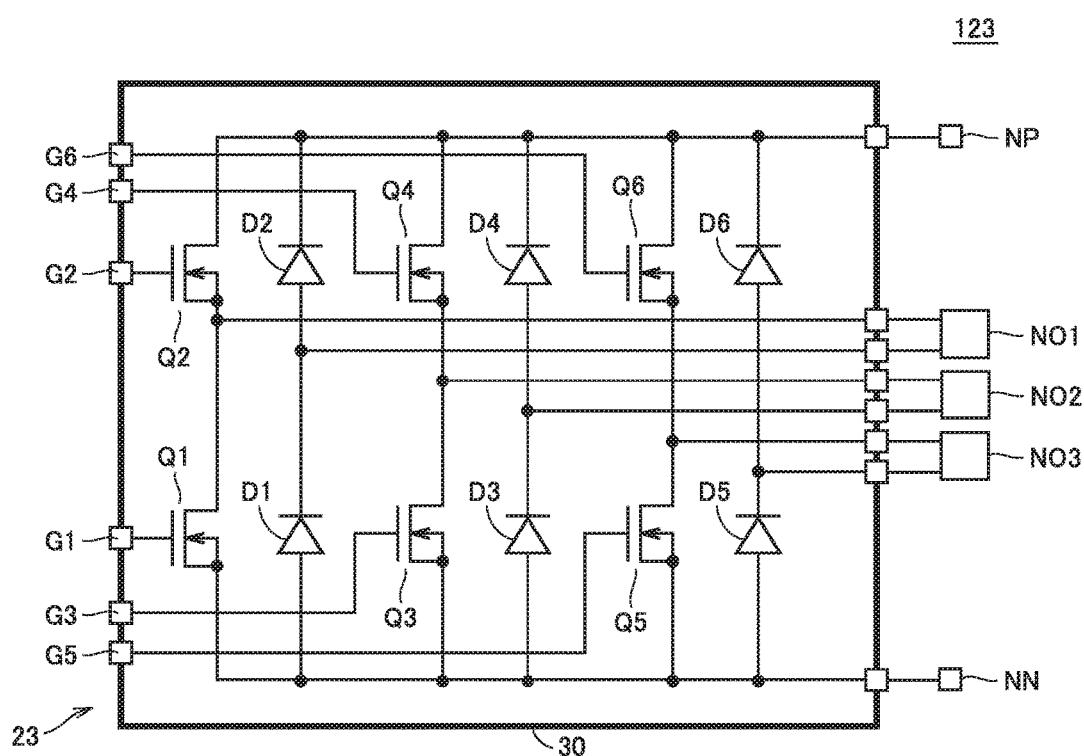
FIG. 8 is a circuit diagram showing a configuration of a power module 23 in a modification of FIG. 7.

FIG. 8 is a circuit diagram showing a configuration of a power module 23 in a modification of FIG. 7. In FIG. 8, an example of the extension from power module 20 in FIG. 1 to a three-phase bridge is shown.

Referring to FIG. 8, power module 23 differs from power module 22 in FIG. 7 in that power module 23 further includes an output terminal MO3, an output terminal DO3, a fifth MOS transistor Q5, a sixth MOS transistor Q6, a fifth Schottky barrier diode D5, and a sixth Schottky barrier diode D6.

Output terminals MO3, DO3 are fixed to casing 30 and connectable to an outside of power module 22. Like the configurations in FIGS. 1 and 7, a characteristic feature is that two separate output terminals MO3, DO3 are provided.

MOS transistor Q5 is contained in casing 30 and connected between negative-side terminal N and output terminal MO3. MOS transistor Q5 is an N-channel MOS transistor having a vertical structure. MOS transistor Q5 has a forward direction from output terminal MO3 to negative-side terminal N (the direction from the drain to the source).

A body diode of MOS transistor Q5 has a forward direction from negative-side terminal N to output terminal MO3 (the direction from the anode to the cathode of the body diode).

MOS transistor Q6 is contained in casing 30 and connected between output terminal MO3 and positive-side terminal P. MOS transistor Q6 is an N-channel MOS transistor having a vertical structure. MOS transistor Q6 has a forward direction from positive-side terminal P to output terminal MO3 (the direction from the drain to the source). A body diode of MOS transistor Q6 has a forward direction from output terminal MO3 to positive-side terminal P (the direction from the anode to the cathode of the body diode).

Schottky barrier diode D5 is contained in casing 30, has an anode connected to negative-side terminal N, and has a cathode connected to output terminal DO3. Schottky barrier diode D6 is contained in casing 30, has a cathode connected to positive-side terminal P, and has an anode connected to output terminal DO3.

In the above-described configuration, no other diode except for respective body diodes of MOS transistors Q1, Q2 is connected to output terminal MO1 which is one of output terminals MO1, MO2, MO3, DO1, DO2, DO3, and no other diode except for respective body diodes of MOS transistors Q3, Q4 is connected to output terminal MO2 which is another one of output terminals MO1, MO2, MO3, DO1, DO2, DO3. Further, no other diode except for respective body diodes of MOS transistors Q5, Q6 is connected to output terminal MO3. Thus, when an energization test is conducted, forward current can be caused to flow in respective body diodes of MOS transistors Q1, Q2, Q3, Q4, Q5, Q6 through corresponding paths which are separate from the paths through Schottky barrier diodes D1, D2, D3, D4, D5, D6.

When the power module is used as a three-phase inverter system 123, a DC voltage is applied between positive-side input node NP connected to positive-side terminal P and negative-side input node NN connected to negative-side terminal N. Further, output terminals MO1, DO1 are connected to a common U-phase output node NO1 configured to output a U-phase AC voltage, output terminals MO2, DO2 are connected to a common V-phase output node NO2 configured to output a V-phase AC voltage, and output terminals MO3, DO3 are connected to a common W-phase output node NO3 configured to output a W-phase AC voltage.

Power module 23 further includes gate terminals G1, G2, G3, G4, G5, G6 and source terminals S2, S4, S6 (not shown), and these gate terminals and source terminals are fixed to casing 30. Gate terminals G1, G2, G3, G4, G5, G6 are connected to respective gates of MOS transistors Q1, Q2, Q3, Q4, Q5, Q6, and source terminals S2, S4, S6 are connected to respective sources of MOS transistors Q2, Q4, Q6. Other features in FIG. 8 are similar to those of the configuration of power module 22 in FIG. 7. Therefore, the same or corresponding elements are denoted by the same reference characters, and the description thereof will not be repeated herein.

[Effects]

Regarding power modules 22, 23 of the third embodiment, forward current can be caused to flow in only the respective body diodes of MOS transistors Q1, Q2, Q3, Q4, Q5, Q6 when an energization test is conducted, like the first embodiment. Therefore, low-quality MOS transistor chips can be screened out efficiently.

<Fourth Embodiment>

[Full-Bridge Configuration]

Figure 9:
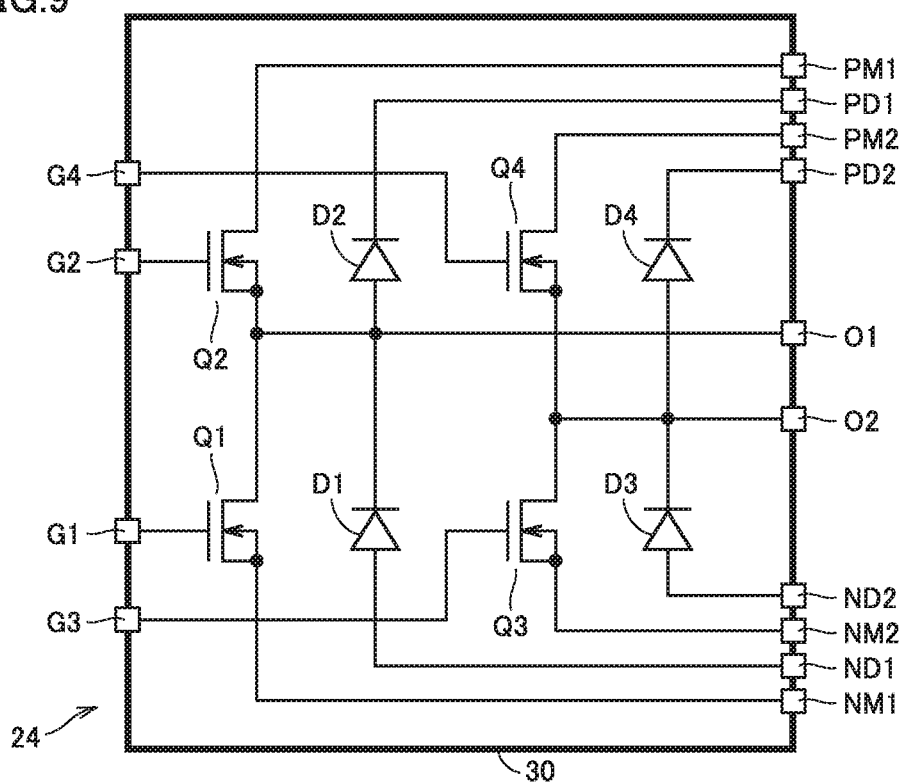
FIG. 9 is a circuit diagram showing a configuration of a power module 24 in a fourth embodiment.

FIG. 9 is a circuit diagram showing a configuration of a power module 24 in a fourth embodiment. In FIG. 9, an example of the extension from power module 21 in FIG. 4 to a full-bridge configuration is shown.

Referring to FIG. 9, power module 24 differs from power module 21 in FIG. 4 in that power module 24 further includes a negative-side terminal NM2, an output terminal O2, a positive-side terminal PM2, a negative-side terminal ND2, and a positive-side terminal PD2. Further, power module 24 differs from power module 21 in FIG. 4 in that power module 24 includes a third MOS transistor Q3, a fourth MOS transistor Q4, a third Schottky barrier diode D3, and a fourth Schottky barrier diode D4.

Like the configuration in FIG. 4, negative-side terminals NM2, ND2, output terminal O2, and positive-side terminals PM2, PD2 are fixed to casing 30 and connectable to an outside of the power module. As shown in FIG. 9, a characteristic feature is that two separate negative-side terminals NM2, ND2 are provided, and two separate positive-side terminals PM2, PD2 are provided.

MOS transistor Q3 is contained in casing 30 and connected between negative-side terminal NM2 and output terminal O2. MOS transistor Q4 is contained in casing 30 and connected between output terminal O2 and positive-side terminal PM2. Schottky barrier diode D3 is contained in casing 30, has an anode connected to negative-side terminal ND2, and has a cathode connected to output terminal O2. Schottky barrier diode D4 is contained in casing 30, has a cathode connected to positive-side terminal PD2, and has an anode connected to output terminal O2.

The connection relation between MOS transistors Q3, Q4, Schottky barrier diodes D3, D4, negative-side terminals NM2, ND2, output terminal O2, and positive-side terminals PM2, PD2 is identical to the connection relation between MOS transistors Q1, Q2, Schottky barrier diodes D1, D2, negative-side terminals NM1, ND1, output terminal O1, and positive-side terminals PM1, PD1. Namely, the power module 24 may be regarded as being equipped with two identical units arranged in parallel. Therefore, the detailed description of the connection relation between the semiconductor devices in FIG. 9, the polarities of the semiconductor devices, and the like will not be repeated herein.

In the above-described configuration, when an energization test is conducted, forward current can be caused to flow in respective body diodes of MOS transistors Q1, Q2, Q3, Q4 through corresponding paths which are separate from the paths through Schottky barrier diodes D1, D2, D3, D4. When the power module is used as an inverter system, positive-side terminals PM1, PD1, PM2, PD2 are connected to a common positive-side input node (not shown), negative-side terminals NM1, ND1, NM2, ND2 are connected to a common negative-side input node (not shown), and a DC voltage is applied between the positive-side input node and the negative-side input node. A U-phase AC voltage is output from output terminal O1 (U-phase output node), and a V-phase AC voltage is output from output terminal O2 (V-phase output node).

Power module 24 further includes gate terminals G1, G2, G3, G4 and source terminals S2, S4 (not shown), and these gate terminals and source terminals are fixed to casing 30. Gate terminals G1, G2, G3, G4 are connected to respective gates of MOS transistors Q1, Q2, Q3, Q4, and source terminals S2, S4 are connected to respective sources of MOS transistors Q2, Q4.

[Three-Phase Bridge Configuration]

Figure 10:
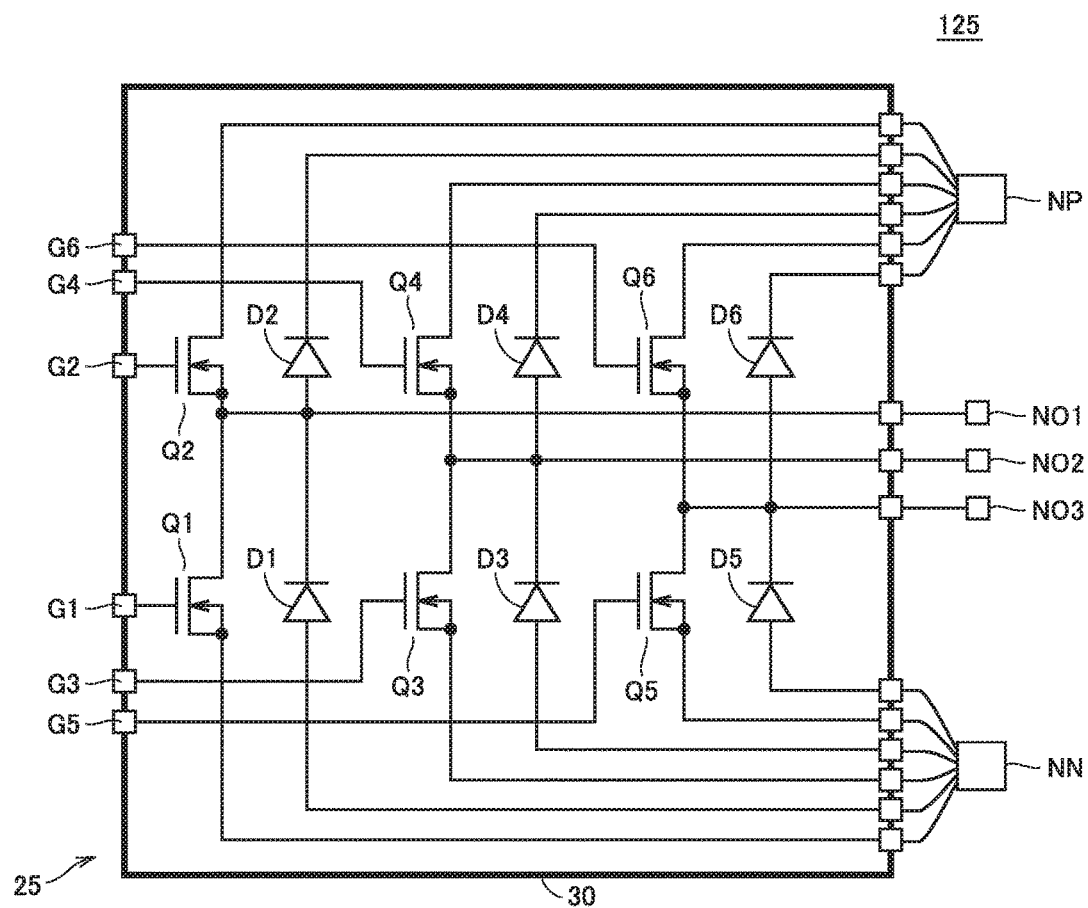
FIG. 10 is a circuit diagram showing a configuration of a power module 25 in a modification of FIG. 9.

FIG. 10 is a circuit diagram showing a configuration of a power module 25 in a modification of FIG. 9. In FIG. 10, an example of the extension from power module 21 in FIG. 4 to a three-phase bridge is shown.

Referring to FIG. 10, power module 25 differs from power module 24 in FIG. 9 in that power module 25 further includes a negative-side terminal NM3, an output terminal O3, a positive-side terminal PM3, a negative-side terminal ND3, and a positive-side terminal PD3. Further, power module 25 differs from power module 24 in FIG. 9 in that power module 25 includes a fifth MOS transistor Q5, a sixth MOS transistor Q6, a fifth Schottky barrier diode D5, and a sixth Schottky barrier diode D6.

Like the configuration in FIG. 9, negative-side terminals NM3, ND3, output terminal O3, and positive-side terminals PM3, PD3 are fixed to casing 30 and connectable to an outside of the power module. As shown in FIG. 9, a characteristic feature is that two separate negative-side terminals NM3, ND3 are provided, and two separate positive-side terminals PM3, PD3 are provided.

MOS transistor Q5 is contained in casing 30 and connected between negative-side terminal NM3 and output terminal O3. MOS transistor Q6 is contained in casing 30 and connected between output terminal O3 and positive-side terminal PM3. Schottky barrier diode D5 is contained in casing 30, has an anode connected to negative-side terminal ND3, and has a cathode connected to output terminal O3. Schottky barrier diode D6 is contained in casing 30, has a cathode connected to positive-side terminal PD3, and has an anode connected to output terminal O3.

The connection relation between MOS transistors Q5, Q6, Schottky barrier diodes D5, D6, negative-side terminals NM3, ND3, output terminal O3, and positive-side terminals PM3, PD3 is identical to the connection relation between MOS transistors Q1, Q2, Schottky barrier diodes D1, D2, negative-side terminals NM1, ND1, output terminal O1, and positive-side terminals PM1, PD1. Namely, the power module 25 in FIG. 10 may be regarded as being equipped with three identical units arranged in parallel. Therefore, the detailed description of the connection relation between the semiconductor devices in FIG. 10, the polarities of the semiconductor devices, and the like will not be repeated herein.

In the above-described configuration, when an energization test is conducted, forward current can be caused to flow in respective body diodes of MOS transistors Q1, Q2, Q3, Q4, Q5, Q6 through corresponding paths which are separate from the paths through Schottky barrier diodes D1, D2, D3, D4, D5, D6.

When the power module is used as a three-phase inverter system 125, positive-side terminals PM1, PD1, PM2, PD2, PM3, PD2 are connected to a common positive-side input node NP, negative-side terminals NM1, ND1, NM2, ND2, NM3, ND3 are connected to a common negative-side input node NN, and a DC voltage is applied between positive-side input node NP and negative-side input node NN. A U-phase AC voltage is output from a U-phase output node NO1 connected to output terminal O1, a V-phase AC voltage is output from a V-phase output node NO2 connected to output terminal O2, and a W-phase AC voltage is output from a W-phase output node NO3 connected to output terminal O3.

Power module 25 further includes gate terminals G1, G2, G3, G4, G5, G6 and source terminals S2, S4, S6 (not shown), and these gate terminals and source terminals are fixed to casing 30. Gate terminals G1, G2, G3, G4, G5, G6 are connected to respective gates of MOS transistors Q1, Q2, Q3, Q4, Q5, Q6, and source terminals S2, S4, S6 are connected to respective sources of MOS transistors Q2, Q4, Q6.

[Effects]

Regarding power modules 24, 25 of the fourth embodiment, forward current can be caused to flow in only the respective body diodes of MOS transistors Q1, Q2, Q3, Q4, Q5, Q6 when an energization test is conducted, like the second embodiment. Therefore, low-quality MOS transistor chips can be screened out efficiently.

<Fifth Embodiment>

[Configuration of Power Module]

Figure 11:
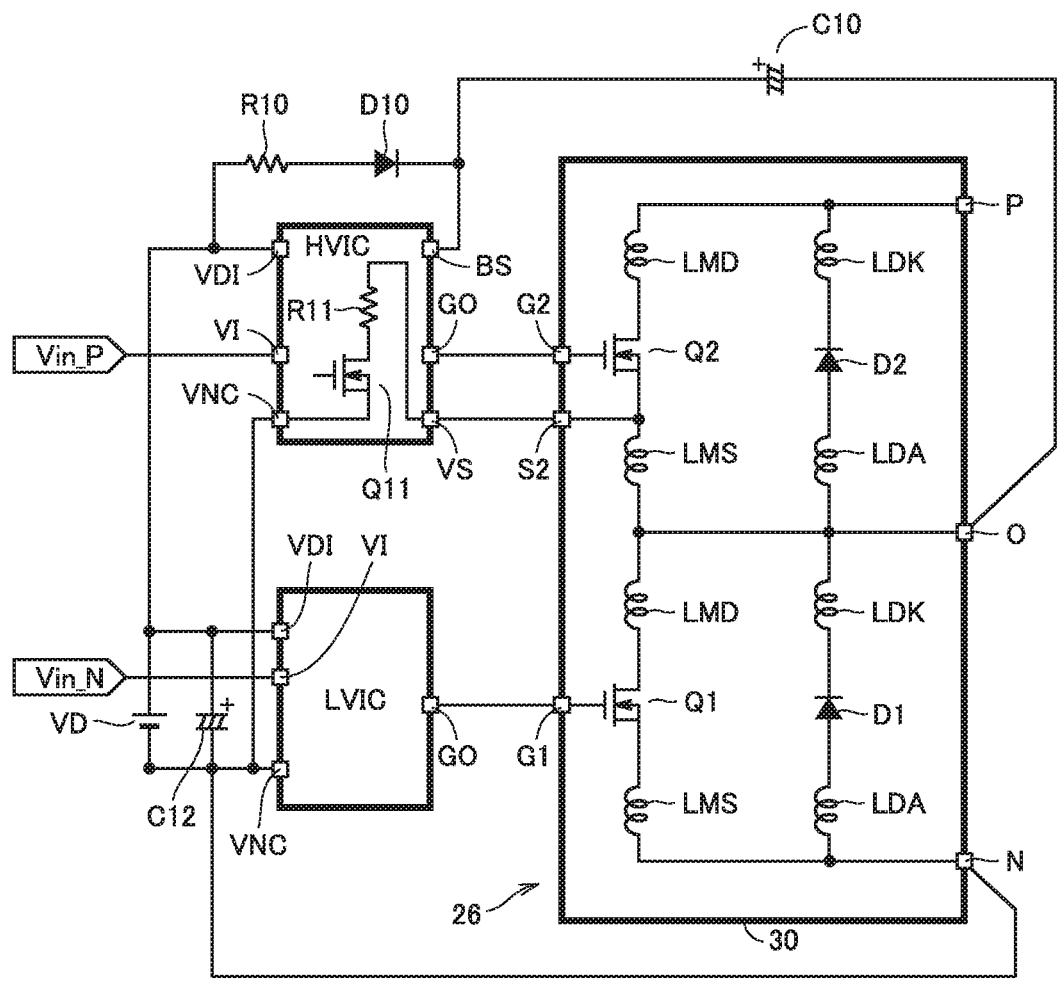
FIG. 11 is a circuit diagram showing a configuration of a power module 26 in a fifth embodiment.

FIG. 11 is a circuit diagram showing a configuration of a power module 26 in a fifth embodiment. FIG. 11 additionally shows a high-voltage integrated circuit HVIC and a low-voltage integrated circuit LVIC which serve as components of a gate driving circuit configured to drive the power module.

In the fifth embodiment shown in FIG. 11, only one positive-side terminal P, only one negative-side terminal N, and only one output terminal O are provided instead of two separate positive-side, negative-side, or output terminals. As described below, electrical characteristics of Schottky barrier diodes D1, D2 are changed so as to allow more current to flow in respective body diodes of MOS transistors Q1, Q2 than the current flowing in Schottky barrier diodes D1, D2, when an energization test is conducted.

Referring to FIG. 11, power module 26 includes a casing 30, negative-side terminal N, output terminal O, positive-side terminal P, first MOS transistor Q1, second MOS transistor Q2, first Schottky barrier diode D1, and second Schottky barrier diode D2.

Power module 26 in FIG. 11 corresponds to power module 20 in FIG. 1 in which output terminals MO1, DO1 are replaced with a common output terminal O. Other features, except for electrical characteristics of Schottky barrier diodes D1, D2, are identical to those of the first embodiment described above in connection with FIG. 1. Therefore, the description thereof will not be repeated herein.

[Configuration of Gate Driving Circuit]

Referring to FIG. 11, a capacitor C10 for bootstrapping is connected between a terminal BS of high-voltage integrated circuit HVIC and output terminal O (the common output terminal provided instead of output terminals MO1, DO1) of power module 26. Other features are identical to those in FIG. 1. Therefore, the same or corresponding elements are denoted by the same reference characters, and the description thereof will not be repeated herein.

[Electrical Characteristics of Schottky Barrier Diodes D1, D2]

Figure 12:
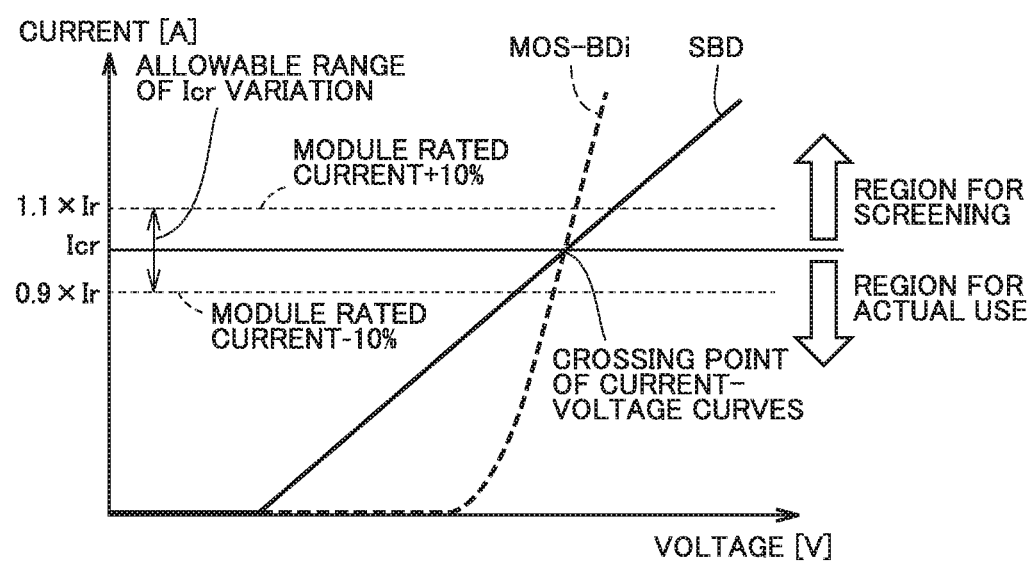
FIG. 12 is a diagram illustrating a relation between an electrical characteristic of a body diode of a MOS transistor Q1 and the electrical characteristic of a Schottky barrier diode D1 in FIG. 11.

FIG. 12 is a diagram illustrating a relation between an electrical characteristic of a body diode of MOS transistor Q1 and the electrical characteristic of Schottky barrier diode D1 in FIG. 11. A relation between the electrical characteristic of a body diode of MOS transistor Q2 and the electrical characteristic of Schottky barrier diode D2 is similar to the above relation.

Specifically, FIG. 12 shows a current-voltage characteristic (MOS-BDi) of the body diode of MOS transistor Q1 and the current-voltage characteristic (SBD) of Schottky barrier diode D1. The rise of forward current in Schottky barrier diode D1 as the applied voltage increases is gentler than the rise of forward current in the body diode of MOS transistor Q1 as the applied voltage increases. Therefore, these current-voltage characteristics cross at a crossing point. In the fifth embodiment, current value Icr at this crossing point is adjusted to fall within ±10% of rated current Ir of the power module (to fall within a range from 0.9×Ir to 1.1×Ir).

The region for actual use of the power module as an inverter is a region lower than rated current Ir (namely lower than current value Icr at the crossing point). Therefore, when freewheeling current flows, the forward current flowing in the body diode of MOS transistor Q1 is smaller than the forward current flowing in Schottky barrier diode D1. As a result of this, degradation of the body diode of the MOS transistor resultant from energization can be suppressed.

In contrast, when low-quality chips are to be screened out by an energization test, forward current larger than rated current Ir is caused to flow in the body diode of MOS transistor Q1 and Schottky barrier diode D1. In this case, the forward current flowing in the body diode of MOS transistor Q1 is larger than the forward current flowing in Schottky barrier diode D1. Therefore, growth of a defect of low-quality chips can be promoted. As a result of this, screening can be performed efficiently.

[Procedure for Testing Power Module]

Figure 13:
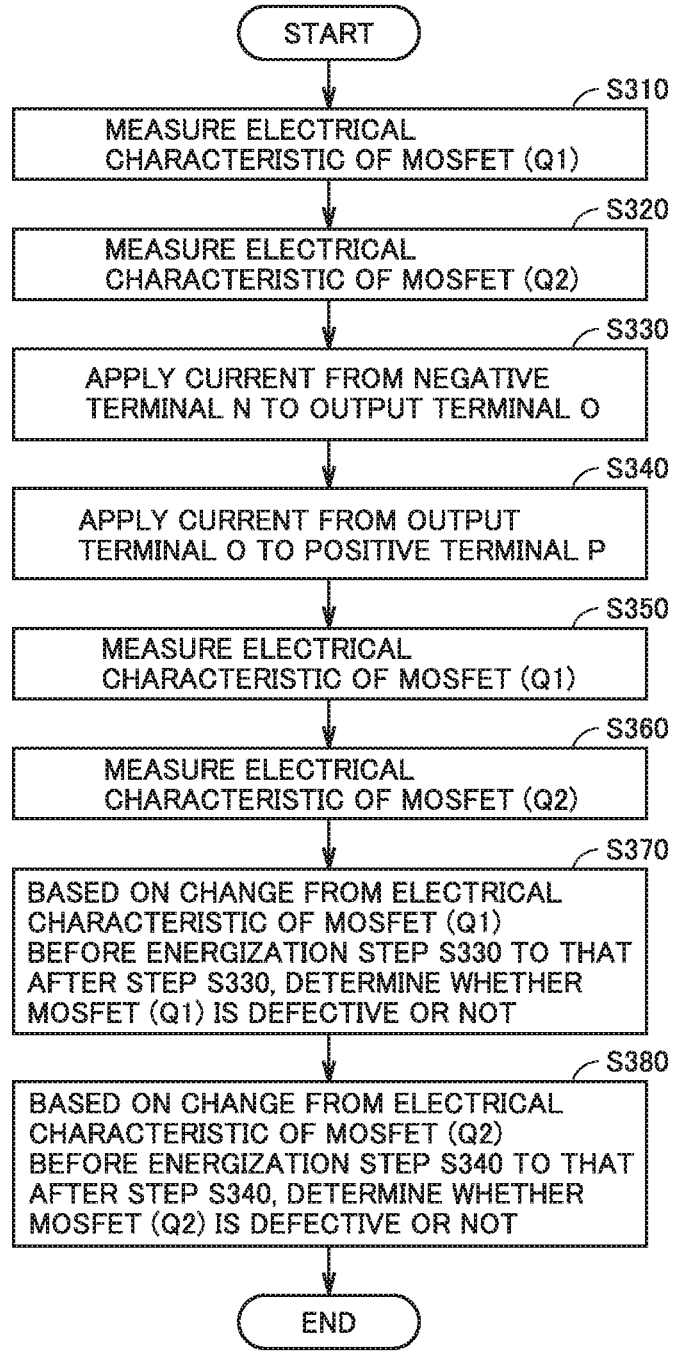
FIG. 13 is a flowchart showing a procedure of an energization test on power module 26 in FIG. 11.

FIG. 13 is a flowchart showing a procedure of an energization test on power module 26 in FIG. 11. Each step in FIG. 13 may be performed by an automatic testing apparatus configured as a computer-based apparatus.

Steps S310, S320, S330, S340, S350, S360, S370, and S380 in FIG. 13 correspond to steps S110, S120, S130, S140, S150, S160, S170, and S180 in FIG. 3, respectively. Except for the energized portion and the amount of current in steps S230, S240, each step in FIG. 13 is substantially identical to the corresponding step in FIG. 3. Therefore, the description thereof will not be repeated herein.

In step S330, DC current larger than rated current Ir of power module 26 is applied for a predetermined time in the direction from negative-side terminal N to output terminal O. Thus, the body diode of MOS transistor Q1 is energized with larger forward current than the forward current with which Schottky barrier diode D1 is energized. In step S340, DC current larger than rated current Ir of power module 26 is applied for a predetermined time in the direction from output terminal O to positive-side terminal P. Thus, the body diode of MOS transistor Q2 is energized with larger forward current than the forward current with which Schottky barrier diode D2 is energized. There is no limitation on which one of steps S330 and S340 is to be performed first.

[Example of Configuration of Freewheeling Diode]

The following is a description of a specific method for adjusting current value Icr at the crossing point of the current-voltage characteristics so that current value Icr falls within ±10% of rated current Ir of the power module as shown in FIG. 12, by changing current-voltage characteristics of Schottky barrier diodes D1, D2.

Figure 14:
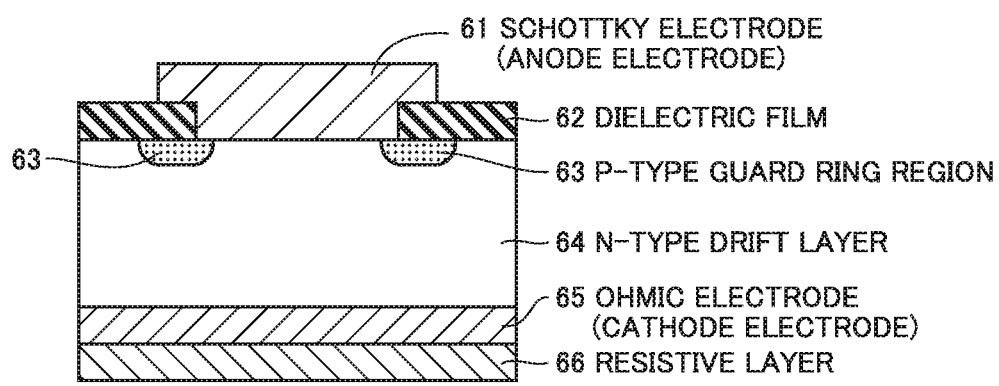
FIG. 14 is a cross-sectional view showing an example of the configuration of Schottky barrier diodes D1, D2 in FIG. 11.

FIG. 14 is a cross-sectional view showing an example of the configuration of Schottky barrier diodes D1, D2 in FIG. 11. Referring to FIG. 14, generally Schottky barrier diodes D1, D2 have a structure in which a Schottky electrode (anode electrode) 61 is deposited on the surface of an N-type drift layer 64. A dielectric film 62 is used as an insulating layer for defining the area of a Schottky junction. In order to suppress electric-field concentration at the edge of the Schottky junction, a P-type guard ring region 63 is provided. On the rear surface of N-type drift layer 64, an ohmic electrode (cathode electrode) 65 is provided.

A characteristic feature in FIG. 14 is that a resistive layer 66 formed of polysilicon or the like is provided on the surface of ohmic electrode (cathode electrode) 65. Resistive layer 66 can reduce forward current flowing in Schottky barrier diodes D1, D2. Thus, as shown in FIG. 12, current value Icr at the crossing point of the current-voltage characteristics can be adjusted to fall within ±10% of rated current Ir of the power module.

In the case of this method by which resistive layer 66 is provided, it is unnecessary to change the chip size of Schottky barrier diodes D1, D2. Therefore, assembly of the chip is less likely to be restricted. Accordingly, a wire interconnection appropriate for a required current capacity can be formed.

Figure 15:
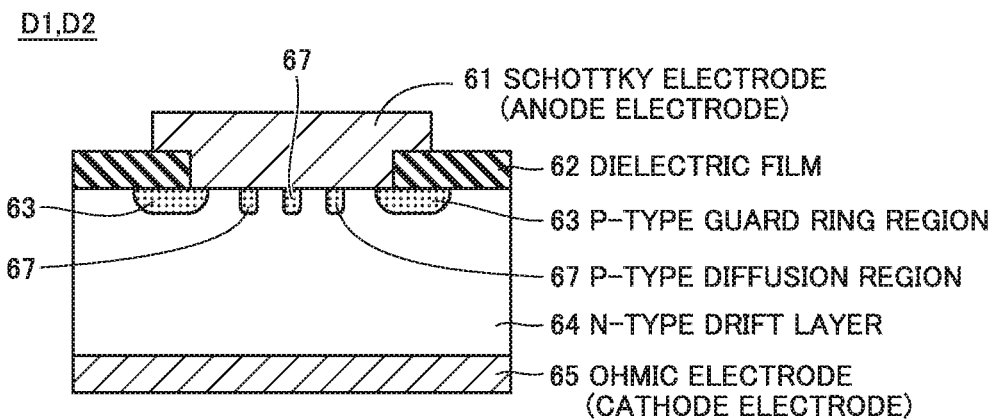
FIG. 15 is a cross-sectional view showing another example of the configuration of Schottky barrier diodes D1, D2 in FIG. 11.

FIG. 15 is a cross-sectional view showing another example of the configuration of Schottky barrier diodes D1, D2 in FIG. 11. Schottky barrier diodes D1, D2 in FIG. 15 are characterized by that a junction barrier Schottky structure is provided instead of resistive layer 66. As shown in FIG. 15, in the junction barrier Schottky diode, a plurality of P-type diffusion regions 67 are provided in a boundary region between an anode electrode 61 and an N-type drift layer 64. Namely, Schottky barrier diodes and PN junction diodes are provided in parallel with each other. The junction area ratio of the PN junction diodes to the total junction can be adjusted to thereby adjust the forward current flowing in Schottky barrier diodes D1, D2.

Further, the configuration in FIG. 15 provides increased inrush current tolerance, and is therefore advantageous when the power module is used as a boost chopper.

[Effects]

As seen from the foregoing, power module 26 in the fifth embodiment enables low-quality chips to be screened out efficiently during an energization test, and enables freewheeling current flowing in the body diode of the MOS transistor in actual use to be smaller than freewheeling current flowing in the freewheeling diode. Since a part of the freewheeling current flows in the body diode in actual use, the ON resistance during freewheeling can be reduced.

<Sixth Embodiment>

[Configuration of Power Module]

Figure 16:
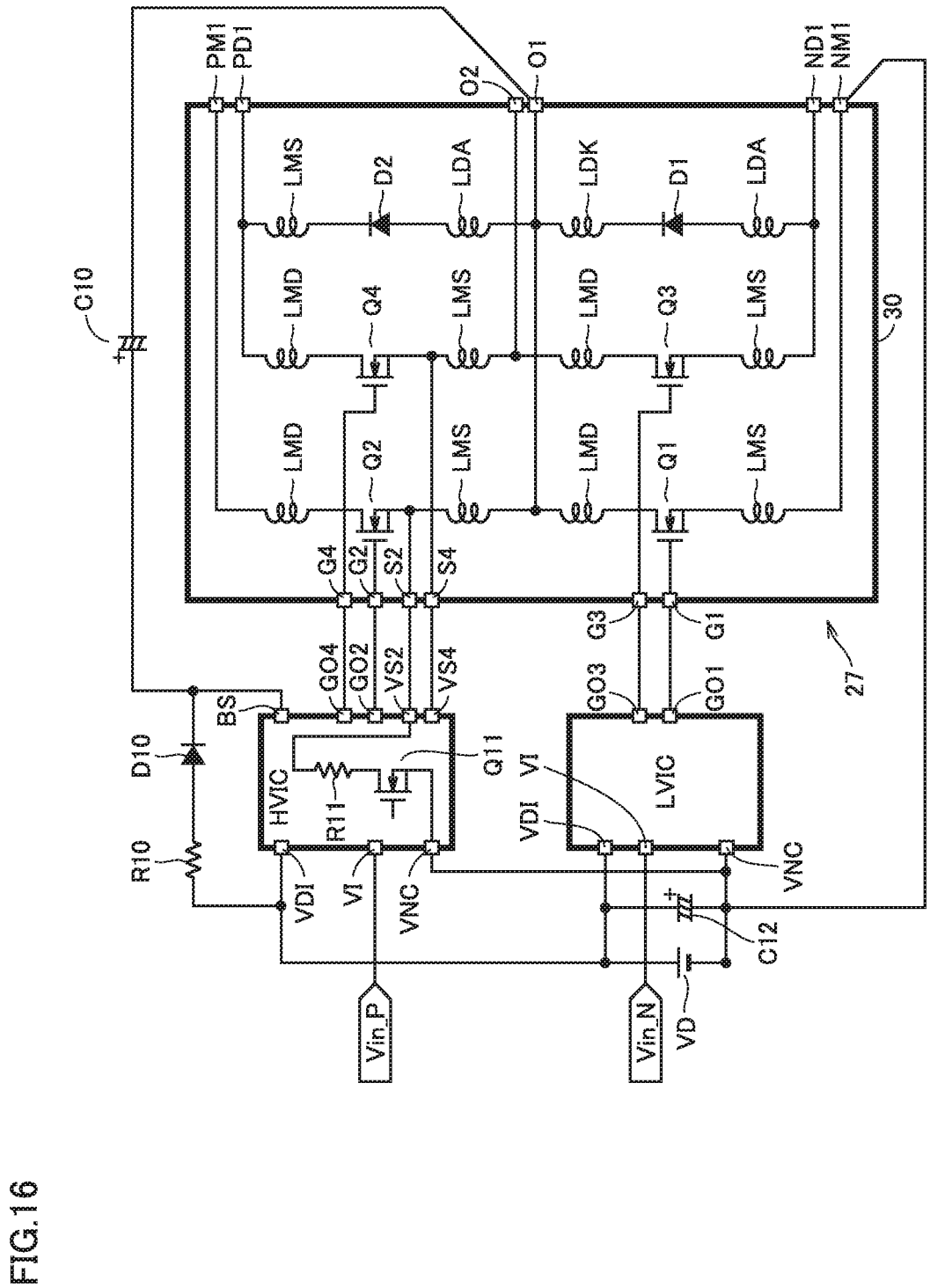
FIG. 16 is a circuit diagram showing a configuration of a power module 27 in a sixth embodiment.

FIG. 16 is a circuit diagram showing a configuration of a power module 27 in a sixth embodiment. FIG. 16 additionally shows a high-voltage integrated circuit HVIC and a low-voltage integrated circuit LVIC which serve as components of a gate driving circuit configured to drive the power module.

Power module 27 in FIG. 16 is equipped with four MOS transistors to thereby enable reduction of the ON resistance when the MOS transistor is conducted. In the following, power module 27 is described as a modification of power module 21 in the second embodiment. However, power module 27 may be considered as a modification of power module 20 in the first embodiment.

Referring to FIG. 16, power module 27 differs from power module 21 in FIG. 4 in that power module 27 further includes an output terminal O2, a third MOS transistor Q3, and a fourth MOS transistor Q4. Like the configuration in FIG. 4, output terminal O2 is fixed to casing 30 and connectable to an outside.

MOS transistor Q3 is contained in casing 30 and connected between negative-side terminal ND1 and output terminal O2. MOS transistor Q3 is an N-channel MOS transistor having a vertical structure. MOS transistor Q3 has a forward direction from output terminal O2 to negative-side terminal ND1 (the direction from the drain to the source). A body diode of MOS transistor Q3 has a forward direction from negative-side terminal ND1 to output terminal O2 (the direction from the anode to the cathode of the body diode).

MOS transistor Q4 is contained in casing 30 and connected between output terminal O2 and positive-side terminal PD1. MOS transistor Q4 is an N-channel MOS transistor having a vertical structure. MOS transistor Q4 has a forward direction from positive-side terminal PD1 to output terminal O2 (the direction from the drain to the source). A body diode of MOS transistor Q4 has a forward direction from output terminal O2 to positive-side terminal PD1 (the direction from the anode to the cathode of the body diode).

Power module 27 further includes gate terminals G1, G2, G3, G4 and source terminals S2, S4 (not shown), and these gate terminals and source terminals are fixed to casing 30. Gate terminals G1, G2, G3, G4 are connected to respective gates of MOS transistors Q1, Q2, Q3, Q4, and source terminals S2, S4 are connected to respective sources of MOS transistors Q2, Q4. Other features in FIG. 16 are similar to those of the configuration of power module 21 in FIG. 4. Therefore, the same or corresponding elements are denoted by the same reference characters, and the description thereof will not be repeated herein.

[Configuration of Gate Driving Circuit]

High-voltage integrated circuit HVIC differs from high-voltage integrated circuit HVIC in FIG. 4 in that the former HVIC further includes a terminal VS4 for making a connection to the source of MOS transistor Q4 and a terminal GO4 for making a connection to the gate of MOS transistor Q4. Since respective functions of them are similar to those for MOS transistor Q2, the description thereof will not be repeated herein. Low-voltage integrated circuit LVIC differs from low-voltage integrated circuit LVIC in FIG. 4 in that the former LVIC further includes a terminal GO3 for making a connection to the gate of MOS transistor Q3. Other features in FIG. 16 are similar to those in FIG. 4.

[Layout of Semiconductor Chip on Insulating Substrate]

Figure 17:
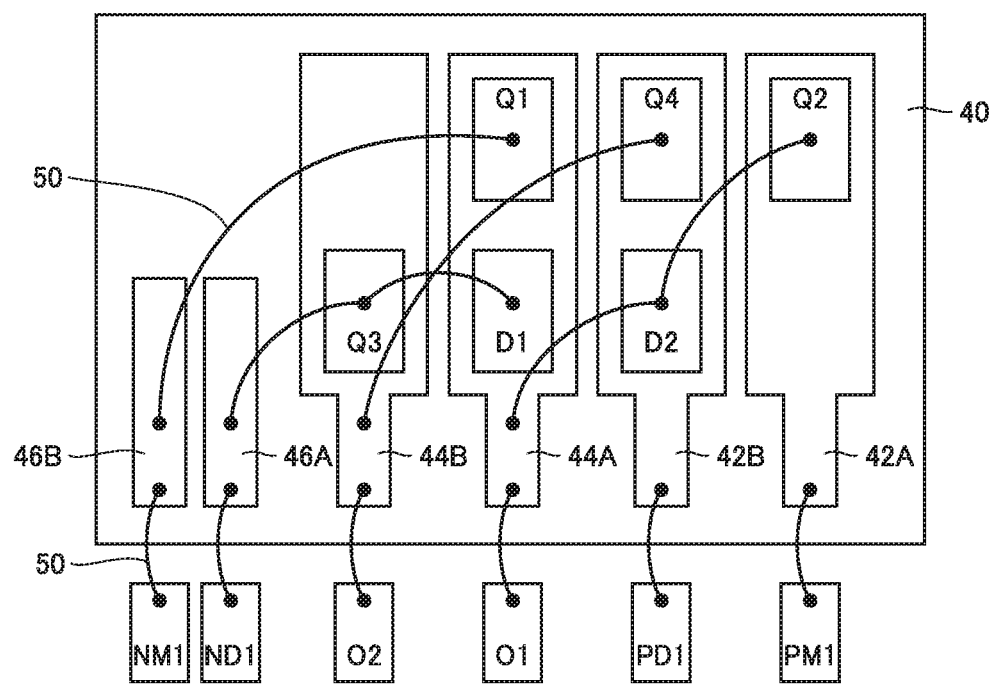
FIG. 17 is a plan view showing an example of the layout of a semiconductor chip contained in power module 27 in FIG. 16.

FIG. 17 is a plan view showing an example of the layout of a semiconductor chip contained in power module 27 in FIG. 16. Referring to FIG. 17, power module 27 further includes an insulating substrate 40 contained in casing 30 in FIG. 16. Power module 27 further includes a conductive pattern 42A, a conductive pattern 42B, a conductive pattern 44A, a conductive pattern 44B, a conductive pattern 46A, and a conductive pattern 46B which are formed of copper foil or the like on insulating substrate 40.

Conductive pattern 42A is connected via a bonding wire 50 to positive-side terminal PM1. Conductive pattern 42B is connected via bonding wire 50 to positive-side terminal PD1. Conductive pattern 44A is connected via bonding wire 50 to output terminal O1. Conductive pattern 44B is connected via bonding wire 50 to output terminal O2. Conductive pattern 46A is connected via bonding wire 50 to negative-side terminal ND1. Conductive pattern 46B is connected via bonding wire 50 to negative-side terminal NM1.

The drain electrode of MOS transistor Q1 and the cathode electrode of Schottky barrier diode D1 are connected by solder onto conductive pattern 44A. The drain electrode of MOS transistor Q2 is connected by solder onto conductive pattern 42A. The drain electrode of MOS transistor Q3 is connected by solder onto conductive pattern 44B. The drain electrode of MOS transistor Q4 and the cathode electrode of Schottky barrier diode D2 are connected by solder onto conductive pattern 42B.

The source electrode of MOS transistor Q1 is connected via bonding wire 50 to conductive pattern 46B. The source electrode of MOS transistor Q3 and the anode electrode of Schottky barrier diode D1 are connected via bonding wire 50 to conductive pattern 46A. The source electrode of MOS transistor Q2 and the anode electrode of Schottky barrier diode D2 are connected via bonding wire 50 to conductive pattern 44A. The source electrode of MOS transistor Q4 is connected via bonding wire 50 to conductive pattern 44B.

It is seen that the layout in FIG. 17 enables the outer package portion of the conventional three-phase inverter module to be used for power module 27 in the sixth embodiment.

[Procedure for Testing Power Module]

Figure 18:
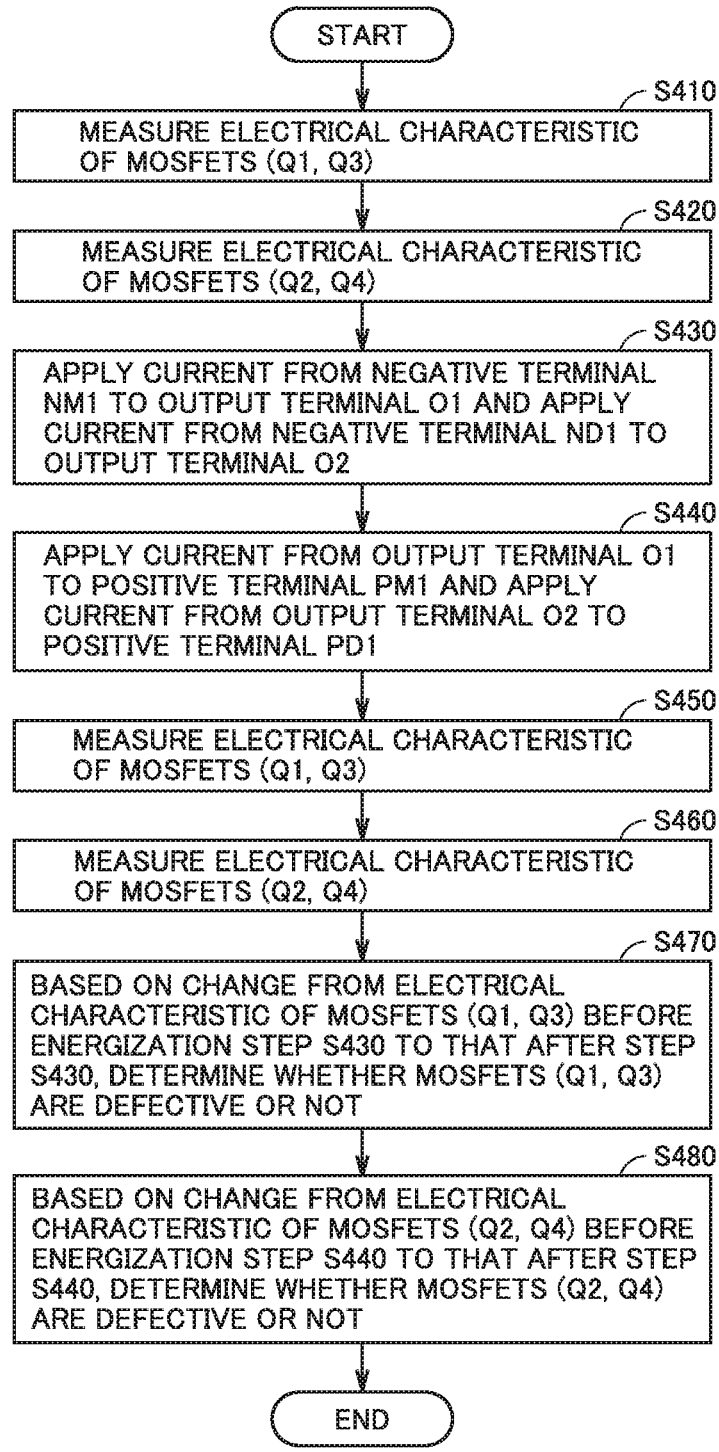
FIG. 18 is a flowchart showing a procedure of an energization test on power module 27 in FIG. 16.

FIG. 18 is a flowchart showing a procedure of an energization test on power module 27 in FIG. 16. Each step in FIG. 18 may be performed by an automatic testing apparatus configured as a computer-based apparatus.

Referring to FIG. 18, before energization of the body diodes of the MOS transistors, measurement of an electrical characteristic of MOS transistors Q1, Q3 (step S410) and measurement of the electrical characteristic of MOS transistors Q2, Q4 (step S420) are initially performed. There is no limitation on which one of steps S410 and S420 is to be performed first. The electrical characteristic to be measured may for example be forward voltage drop and/or forward leakage current.

Next, DC current is applied for a predetermined time in the direction from negative-side terminal NM1 to output terminal O1, to thereby energize the body diode of MOS transistor Q1 with forward current, and DC current is applied for a predetermined time in the direction from negative-side terminal ND1 to output terminal O2, to thereby energize the body diode of MOS transistor Q3 with forward current (step S430). Further, DC current is applied for a predetermined time in the direction from output terminal O1 to positive-side terminal PM1, to thereby energize the body diode of MOS transistor Q2 with forward current, and DC current is applied for a predetermined time in the direction from output terminal O2 to positive-side terminal PD1, to thereby energize the body diode of MOS transistor Q4 with forward current (step S440). There is no limitation on which one of steps S430 and S440 is to be performed first.

After the above-described energization steps S430, S440, measurement of the electrical characteristic of MOS transistors Q1, Q3 (step S450) and measurement of the electrical characteristic of MOS transistor Q2, Q4 (step S460) are performed. The electrical characteristic to be measured is the same as that in steps S410, S420. There is no limitation on which one of steps S450 and S460 is to be performed first.

After this, based on a change from the electrical characteristic of MOS transistors Q1, Q3 before energization step S430 to the electrical characteristic thereof after energization step S430, it is determined whether MOS transistors Q1, Q3 are defective or not (step S470). Further, based on a change from the electrical characteristic of MOS transistors Q2, Q4 before energization step S440 to the electrical characteristic thereof after energization step S440, it is determined whether MOS transistors Q2, Q4 are defective or not (step S480). For example, when the forward voltage drop and/or the forward leakage current of an MOS transistor have hardly changed, the MOS transistor is determined as non-defective. In contrast, when the value representing the forward voltage drop and/or the value representing the forward leakage current has changed to exceed a threshold value, the MOS transistor is determined as defective. There is no limitation on which one of steps S470 and S480 is to be performed first.

[Effects]

Regarding power module 27 of the sixth embodiment, when an energization test is conducted, forward current can be caused to flow in only the respective body diodes of MOS transistors Q1, Q2, Q3, Q4 through corresponding paths which are separate from the paths through freewheeling diodes D1, D2. Therefore, low-quality MOS transistor chips can be screened out efficiently. In normal use, MOS transistors Q1, Q3 are connected in parallel and MOS transistors Q2, Q4 are connected in parallel. Accordingly, the ON resistance when the MOS transistor is conducted can be reduced.

Further, the arrangement on the chip and the wire as described above in connection with FIG. 17 can be used to provide a half-bridge module to which the outer package portion of the conventional three-phase inverter module is applicable.

[Configuration of Three-Phase Inverter System]

Figure 19:
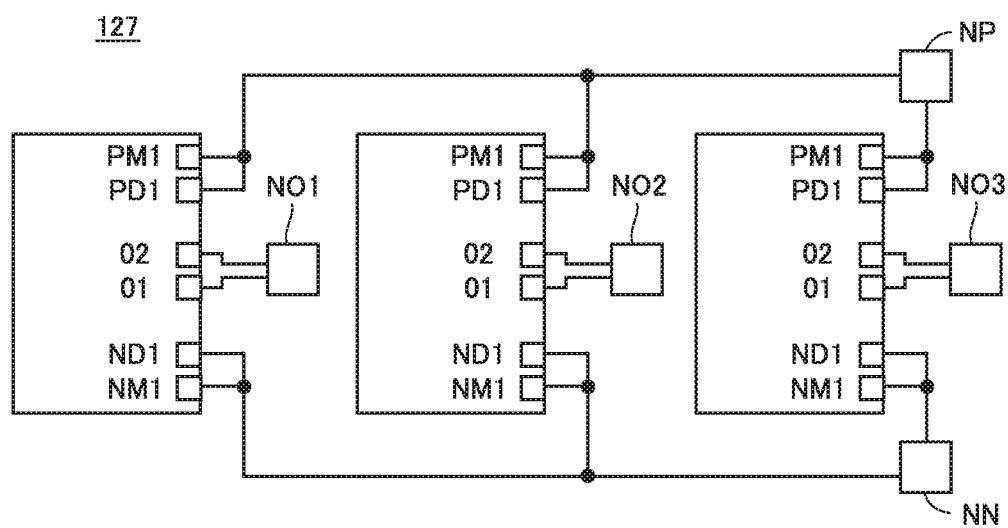
FIG. 19 is a diagram showing a configuration of a three-phase inverter system in which the power module in FIG. 16 is used.

FIG. 19 is a diagram showing a configuration of a three-phase inverter system in which the power module in FIG. 16 is used. Three power modules 27 in FIG. 16 may be used (the three power modules are referred to as power modules 27A, 27B, 27C) to form a three-phase inverter system 127.

Specifically, referring to FIG. 19, power modules 27A, 27B, 27C each have positive-side terminals PM1, PD1 connected to a common positive-side input node NP, power modules 27A, 27B, 27C each have negative-side terminals ND1, NM1 connected to a common negative-side input node NN, and a DC voltage is applied between positive-side input node NP and negative-side input node NN. Output terminals O1, O2 of power module 27A are connected to a common U-phase output node NO1 configured to output a U-phase AC voltage. Output terminals O1, O2 of power module 27B are connected to a common V-phase output node NO2 configured to output a V-phase AC voltage. Output terminals O1, O2 of power module 27C are connected to a common W-phase output node NO3 configured to output a W-phase AC voltage.

<Supplementary Notes>

The following is a summary of a part of the above-described embodiments.

(1) A power module 20 in the first embodiment includes: a casing 30; a first terminal N, a second terminal MO1, a third terminal P, and a fourth terminal DO1; a first MOS transistor Q1; a second MOS transistor Q2; a first Schottky barrier diode D1; and a second Schottky barrier diode D2. First terminal N, second terminal MO1, third terminal P, and fourth terminal DO1 are fixed to casing 30 and connectable to an outside. First MOS transistor Q1 is contained in casing 30, connected between first terminal N and second terminal MO1, and has a forward direction from second terminal MO1 to first terminal N. Second MOS transistor Q2 is contained in casing 30, connected between second terminal MO1 and third terminal P, and has a forward direction from third terminal P to second terminal MO1. First Schottky barrier diode D1 is contained in casing 30, has an anode connected to first terminal N, and has a cathode connected to fourth terminal DO1. Second Schottky barrier diode D2 is contained in casing 30, has a cathode connected to third terminal P, and has an anode connected to fourth terminal DO1. No other diode, except for respective body diodes of first MOS transistor Q1 and second MOS transistor Q2, is connected to second terminal MO1.

(2) A power module 21 in the second embodiment includes a casing 30; a first terminal NM1, a second terminal O1, a third terminal PM1, a fourth terminal ND1, and a fifth terminal PD1; a first MOS transistor Q1; a second MOS transistor Q2; a first Schottky barrier diode D1; and a second Schottky barrier diode D2. First terminal NM1, second terminal O1, third terminal PM1, fourth terminal ND1, and fifth terminal PD1 are fixed to casing 30 and connectable to an outside. First MOS transistor Q1 is contained in casing 30, connected between first terminal NM1 and second terminal O1, and has a forward direction from second terminal O1 to first terminal NM1. Second MOS transistor Q2 is contained in casing 30, connected between second terminal O1 and third terminal PM1, and has a forward direction from third terminal PM1 to second terminal O1. First Schottky barrier diode D1 is contained in casing 30, has a cathode connected to second terminal O1, and has an anode connected to fourth terminal ND1. Second Schottky barrier diode D2 is contained in casing 30, has an anode connected to second terminal O1, and has a cathode connected to fifth terminal PD1.

(3) Power module 22 in the third embodiment further includes, in addition to the components of power module 20 in the first embodiment, a fifth terminal MO2, a sixth terminal DO2, a third MOS transistor Q3, a fourth MOS transistor Q4, a third Schottky barrier diode D3, and a fourth Schottky barrier diode D4. Fifth terminal MO2 and sixth terminal DO2 are fixed to casing 30 and connectable to an outside. Third MOS transistor Q3 is contained in casing 30, connected between first terminal N and fifth terminal MO2, and has a forward direction from fifth terminal MO2 to first terminal N. Fourth MOS transistor Q4 is contained in casing 30, connected between third terminal P and fifth terminal MO2, and has a forward direction from third terminal P to fifth terminal MO2. Third Schottky barrier diode D3 is contained in casing 30, has an anode connected to first terminal N, and has a cathode connected to sixth terminal DO2. Fourth Schottky barrier diode D4 is contained in casing 30, has a cathode connected to third terminal P, and has an anode connected to sixth terminal DO2.

(4) A power module 23 in a modification of the third embodiment further includes, in addition to the components of power module 22 in the third embodiment, a seventh terminal MO3, an eighth terminal DO3, a fifth MOS transistor Q5, a sixth MOS transistor Q6, a fifth Schottky barrier diode D5, and a sixth Schottky barrier diode D6. Seventh terminal MO3 and eighth terminal DO3 are fixed to casing 30 and connectable to an outside. Fifth MOS transistor Q5 is contained in casing 30, connected between first terminal N and seventh terminal MO3, and has a forward direction from seventh terminal MO3 to first terminal N. Sixth MOS transistor Q6 is contained in casing 30, connected between third terminal P and seventh terminal MO3, and has a forward direction from third terminal P to seventh terminal MO3. Fifth Schottky barrier diode D5 is contained in casing 30, has an anode connected to first terminal N, and has a cathode connected to eighth terminal DO3. Sixth Schottky barrier diode D6 is contained in casing 30, has a cathode connected to third terminal P, and has an anode connected to eighth terminal DO3.

(5) Power module 24 in the fourth embodiment further includes, in addition to the components of power module 21 in the second embodiment: a sixth terminal NM2, a seventh terminal O2, an eighth terminal PM2, a ninth terminal ND2, and a 10th terminal PD2; a third MOS transistor Q3; a fourth MOS transistor Q4; a third Schottky barrier diode D3; and a fourth Schottky barrier diode D4. Sixth terminal NM2, seventh terminal O2, eighth terminal PM2, ninth terminal ND2, and 10th terminal PD2 are fixed to casing 30 and connectable to an outside. Third MOS transistor Q3 is contained in casing 30, connected between sixth terminal NM2 and seventh terminal O2, and has a forward direction from seventh terminal O2 to sixth terminal NM2. Fourth MOS transistor Q4 is contained in casing 30, connected between seventh terminal O2 and eighth terminal PM2, and has a forward direction from eighth terminal PM2 to seventh terminal O2. Third Schottky barrier diode D3 is contained in casing 30, has a cathode connected to seventh terminal O2, and has an anode connected to ninth terminal ND2. Fourth Schottky barrier diode D4 is contained in casing 30, has an anode connected to seventh terminal O2, and has a cathode connected to 10th terminal PD2.

(6) Power module 25 in the fourth embodiment further includes, in addition to the components of power module 24 in the fourth embodiment: an 11th terminal NM3, a 12th terminal O3, a 13th terminal PM3, a 14th terminal ND3, and a 15th terminal PD3; a fifth MOS transistor Q5; a sixth MOS transistor Q6; a fifth Schottky barrier diode D5; and a sixth Schottky barrier diode D6. 11th terminal NM3, 12th terminal O3, 13th terminal PM3, 14th terminal ND3, and 15th terminal PD3 are fixed to casing 30 and connectable to an outside. Fifth MOS transistor Q5 is contained in casing 30, connected between 11th terminal NM3 and 12th terminal O3, and has a forward direction from 12th terminal O3 to 11th terminal NM3. Sixth MOS transistor Q6 is contained in casing 30, connected between 12th terminal O3 and 13th terminal PM3, and has a forward direction from 13th terminal PM3 to 12th terminal O3. Fifth Schottky barrier diode D5 is contained in casing 30, has a cathode connected to 12th terminal O3, and has an anode connected to 14th terminal ND3. Sixth Schottky barrier diode D6 is contained in casing 30, has an anode connected to 12th terminal O3, and has a cathode connected to 15th terminal PD3.

(7) Power module 27 in the sixth embodiment further includes, in addition to the components of power module 21 in the second embodiment, a sixth terminal O2, a third MOS transistor Q3, and a fourth MOS transistor Q4. Sixth terminal O2 is fixed to casing 30 and connectable to an outside. Third MOS transistor Q3 is contained in casing 30, connected between fourth terminal ND1 and sixth terminal O2, and has a forward direction from sixth terminal O2 to fourth terminal ND1. Fourth MOS transistor Q4 is contained in casing 30, connected between fifth terminal PD1 and sixth terminal O2, and has a forward direction from fifth terminal PD1 to sixth terminal O2.

(8) Power module 27 in the sixth embodiment further includes: an insulating substrate 40 contained in the casing; and a first conductive pattern 46B, a second conductive pattern 44A, a third conductive pattern 42A, a fourth conductive pattern 46A, a fifth conductive pattern 42B, and a sixth conductive pattern 44B which are formed on insulating substrate 40 and connected respectively to first terminal NM1, second terminal O1, third terminal PM1, fourth terminal ND1, fifth terminal PD1, and sixth terminal O2. A positive-side main electrode of first MOS transistor Q1 and the cathode of first Schottky barrier diode D1 are connected by solder to second conductive pattern 44A. A positive-side main electrode of second MOS transistor Q2 is connected by solder to third conductive pattern 42A. A positive-side main electrode of third MOS transistor Q3 is connected by solder to sixth conductive pattern 44B. A positive-side main electrode of fourth MOS transistor Q4 and the cathode of second Schottky barrier diode D2 are connected by solder to fifth conductive pattern 42B. A negative-side main electrode of first MOS transistor Q1 is connected via a wire to first conductive pattern 46B. A negative-side main electrode of second MOS transistor Q2 and the anode of second Schottky barrier diode D2 are connected via a wire to second conductive pattern 44A. A negative-side main electrode of third MOS transistor Q3 and the anode of first Schottky barrier diode D1 are connected via a wire to fourth conductive pattern 46A. A negative-side main electrode of fourth MOS transistor Q4 is connected via a wire to sixth conductive pattern 44B.

(9) A power module 26 in the fifth embodiment includes: a casing 30; a first terminal N, a second terminal O, and a third terminal P; a first MOS transistor Q1; a second MOS transistor Q2; a first Schottky barrier diode D1; and a second Schottky barrier diode D2. First terminal N, second terminal O, and third terminal P are fixed to casing 30 and connectable to an outside. First MOS transistor Q1 is contained in casing 30, connected between first terminal N and second terminal O, and has a forward direction from second terminal O to first terminal N. Second MOS transistor Q2 is contained in casing 30, connected between second terminal O and third terminal P, and has a forward direction from third terminal P to second terminal O. First Schottky barrier diode D1 is contained in casing 30, is in parallel with first MOS transistor Q1, has an anode connected to first terminal N, and has a cathode connected to second terminal O. Second Schottky barrier diode D2 is contained in casing 30, is in parallel with second MOS transistor Q2, has an anode connected to second terminal O, and has a cathode connected to third terminal P. A current value at a first crossing point is within a range of ±10% of a rated current of power module 26, where the first crossing point is a crossing point of:

a current-voltage characteristic of first MOS transistor Q1 when forward current is caused to flow in a body diode of first MOS transistor Q1; and a current-voltage characteristic of first Schottky barrier diode D1 when forward current is caused to flow in first Schottky barrier diode D1. A current value at a second crossing point is within a range of ±10% of the rated current of power module 26, where the second crossing point is a crossing point of:

a current-voltage characteristic of second MOS transistor Q2 when forward current is caused to flow in a body diode of second MOS transistor Q2; and a current-voltage characteristic of second Schottky barrier diode D2 when forward current is caused to flow in second Schottky barrier diode D2.

(10) Regarding the above (9), each of first Schottky barrier diode D1 and second Schottky barrier diode D2 includes a resistive layer 66 formed on a surface of a cathode electrode layer 65.

(11) Regarding the above (9), each of first Schottky barrier diode D1 and second Schottky barrier diode D2 has a junction barrier Schottky structure.

(12) Regarding the above (1) to (11), each of MOS transistors Q1-Q6 and Schottky barrier diodes D1-D6 is formed using a semiconductor material having a larger bandgap than silicon.

(13) A three-phase inverter system 123 in the third embodiment is configured to convert a DC voltage which is input from a positive-side input node NP and a negative-side input node NN to a three-phase AC voltage, and output the three-phase AC voltage from a first phase output node NO1, a second phase output node NO2, and a third phase output node NO3. Three-phase inverter system 123 includes power module 23 as described under the above (4). First terminal N is connected to negative-side input node NN. Third terminal P is connected to positive-side input node NP. Second terminal MO1 and fourth terminal DO1 are connected to first phase output node NO1. Fifth terminal MO2 and sixth terminal DO2 are connected to second phase output node NO2. Seventh terminal MO3 and eighth terminal DO3 are connected to third phase output node NO3.

(14) A three-phase inverter system 125 in the fourth embodiment is configured to convert a DC voltage which is input from a positive-side input node NP and a negative-side input node NN to a three-phase AC voltage, and output the three-phase AC voltage from a first phase output node NO1, a second phase output node NO2, and a third phase output node NO3. The three-phase inverter system includes power module 25 as described under the above (6). First terminal NM1, fourth terminal ND1, sixth terminal NM2, ninth terminal ND2, 11th terminal NM3, and 14th terminal ND3 are connected to negative-side input node NN. Third terminal PM1, fifth terminal PD1, eighth terminal PM2, 10th terminal PD2, 13th terminal PM3, and 15th terminal PD3 are connected to positive-side input node NP. Second terminal O1 is connected to first phase output node NO1. Seventh terminal O2 is connected to second phase output node NO2. 12th terminal O3 is connected to third phase output node NO3.

(15) A three-phase inverter system 127 in the sixth embodiment is configured to convert a DC voltage which is input from a positive-side input node NP and a negative-side input node NN to a three-phase AC voltage, and output the three-phase AC voltage from a first phase output node NO1, a second phase output node NO2, and a third phase output node NO3. Three-phase inverter system 127 includes three power modules 27 as described under the above (7), namely a first power module 27A, a second power module 27B, and a third power module 27C. First terminal NM1 and fourth terminal ND1 of each of first power module 27A, second power module 27B, and third power module 27C are connected to negative-side input node NN. Third terminal PM1 and fifth terminal PD1 of each of first power module 27A, second power module 27B, and third power module 27C are connected to positive-side input node NP. Second terminal O1 and sixth terminal O2 of first power module 27A is connected to first phase output node NO1. Second terminal O1 and sixth terminal O2 of second power module 27B are connected to second phase output node NO2. Second terminal O1 and sixth terminal O2 of third power module 27C are connected to third phase output node NO3.

(16) A method of testing a power module (20, 21) as described under the above (1) or (2) is provided. This testing method includes: first energization for applying DC current in a direction from the first terminal (N, NM1) to the second terminal (MO1, O1); second energization for applying DC current in a direction from the second terminal (MO1, O1) to the third terminal (P, PM1); determining a quality of first MOS transistor Q1 based on a change from an electrical characteristic of first MOS transistor Q1 before the first energization to the electrical characteristic of first MOS transistor Q1 after the first energization; and determining a quality of second MOS transistor Q2 based on a change from the electrical characteristic of second MOS transistor Q2 before the second energization to the electrical characteristic of second MOS transistor Q2 after the second energization.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power module comprising:
a casing;
a first terminal, a second terminal, and a third terminal, each being fixed to the casing and connectable to an outside;
a first MOS transistor contained in the casing, connected between the first terminal and the second terminal, and having a forward direction from the second terminal to the first terminal;
a second MOS transistor contained in the casing, connected between the second terminal and the third terminal, and having a forward direction from the third terminal to the second terminal;
a first Schottky barrier diode contained in the casing, being in parallel with the first MOS transistor, having an anode connected to the first terminal, and having a cathode connected to the second terminal; and
a second Schottky barrier diode contained in the casing, being in parallel with the second MOS transistor, having an anode connected to the second terminal, and having a cathode connected to the third terminal,
each of the first Schottky barrier diode and the second Schottky barrier diode including a resistive layer formed of polysilicon in direct contact with a surface of a cathode electrode layer on a side of the cathode electrode layer opposite to an n-type drift layer having a p-type guard ring region which is in direct contact with portions of a dielectric film and a Schottky anode electrode,
the resistive layer of the first Schottky barrier diode being configured such that:
a current value at a first crossing point is within a range of ±10% of a rated current of the power module, the first crossing point being a crossing point of:
a current-voltage characteristic graph of the first MOS transistor when forward current is caused to flow in a body diode of the first MOS transistor crossing a current-voltage characteristic graph of the first Schottky barrier diode when forward current is caused to flow in the first Schottky barrier diode,
the resistive layer of the second Schottky barrier diode being configured such that:
a current value at a second crossing point is within a range of ±10% of the rated current of the power module, the second crossing point being a crossing point of:
a current-voltage characteristic graph of the second MOS transistor when forward current is caused to flow in a body diode of the second MOS transistor crossing a current-voltage characteristic graph of the second Schottky barrier diode when forward current is caused to flow in the second Schottky barrier diode.

2. A power module comprising:
a casing;
a first terminal, a second terminal, and a third terminal, each being fixed to the casing and connectable to an outside;
a first MOS transistor contained in the casing, connected between the first terminal and the second terminal, and having a forward direction from the second terminal to the first terminal;
a second MOS transistor contained in the casing, connected between the second terminal and the third terminal, and having a forward direction from the third terminal to the second terminal;
a first Schottky barrier diode contained in the casing, being in parallel with the first MOS transistor, having an anode connected to the first terminal, and having a cathode connected to the second terminal; and a second Schottky barrier diode contained in the casing, being in parallel with the second MOS transistor, having an anode connected to the second terminal, and having a cathode connected to the third terminal, each of the first Schottky barrier diode and the second Schottky barrier diode having a junction barrier Schottky structure in which a plurality of P-type diffusion regions are provided in a boundary region between an anode electrode and an N-type drift layer, and having a p-type guard ring region which is in direct contact with portions of a dielectric film and the anode electrode, the area ratio of the P-type diffusion regions to the total junction regarding the first Schottky barrier diode being configured such that:
  a current value at a first crossing point is within a range of ±10% of a rated current of the power module, the first crossing point being a crossing point of:
    a current-voltage characteristic graph of the first MOS transistor when forward current is caused to flow in a body diode of the first MOS transistor crossing a current-voltage characteristic graph of the first Schottky barrier diode when forward current is caused to flow in the first Schottky barrier diode, the area ratio of the P-type diffusion regions to the total junction regarding the second Schottky barrier diode being configured such that:
  a current value at a second crossing point is within a range of ±10% of the rated current of the power module, the second crossing point being a crossing point of:
    a current-voltage characteristic graph of the second MOS transistor when forward current is caused to flow in a body diode of the second MOS transistor crossing a current-voltage characteristic graph of the second Schottky barrier diode when forward current is caused to flow in the second Schottky barrier diode.

3. The power module according to claim 1, wherein each of the MOS transistors and the Schottky barrier diodes is formed using a semiconductor material having a larger bandgap than silicon.

\* \* \* \* \*